(12) United States Patent
Ginetti

(10) Patent No.: US 10,055,529 B1
(45) Date of Patent: Aug. 21, 2018

(54) METHODS, SYSTEMS, AND COMPUTER PROGRAM PRODUCT FOR IMPLEMENTING A FLOORPLAN WITH VIRTUAL HIERARCHIES AND FIGURE GROUPS FOR AN ELECTRONIC DESIGN

(71) Applicant: Cadence Design Systems, Inc., San Jose, CA (US)

(72) Inventor: Arnold Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/283,089

(22) Filed: Sep. 30, 2016

(51) Int. Cl.
   *G06F 17/50* (2006.01)
(52) U.S. Cl.
   CPC ...... *G06F 17/5072* (2013.01); *G06F 17/5081* (2013.01)
(58) Field of Classification Search
   CPC .............. G06F 17/5045; G06F 17/5072; G06F 17/5081
   USPC ......................................... 716/100, 118, 119
   See application file for complete search history.

(56) References Cited

U.S. PATENT DOCUMENTS

| | | | |
|---|---|---|---|
| 6,256,768 B1 | 7/2001 | Igusa | |
| 7,062,475 B1 | 6/2006 | Szabo | |
| 7,117,473 B1 | 10/2006 | Knol | |
| 7,120,892 B1 | 10/2006 | Knol | |
| 7,469,255 B2 | 12/2008 | Kusterer | |
| 7,555,739 B1 * | 6/2009 | Ginetti et al. | G06F 17/5045 716/107 |
| 7,710,420 B2 | 5/2010 | Nonclercq | |
| 7,810,064 B2 | 10/2010 | Ladin | |
| 7,921,096 B2 | 4/2011 | Allen | |
| 8,271,920 B2 * | 9/2012 | Cho et al. | G06F 17/5068 716/104 |
| 8,438,530 B2 | 5/2013 | Giffel | |
| 8,527,890 B2 | 9/2013 | Harada | |
| 8,595,237 B1 | 11/2013 | Chaudhary | |
| 8,930,863 B2 * | 1/2015 | Nayak et al. | G06F 17/5081 716/104 |
| 2003/0101331 A1 | 5/2003 | Boylan | |
| 2004/0083210 A1 | 4/2004 | Ochiai | |
| 2004/0088487 A1 * | 5/2004 | Barroso et al. | G06F 12/0826 711/122 |
| 2005/0091627 A1 | 4/2005 | Satapathy | |

(Continued)

OTHER PUBLICATIONS

Non-Final Office Action dated Mar. 26, 2018 for U.S. Appl. No. 15/283,081.

(Continued)

*Primary Examiner* — Sun Lin
(74) *Attorney, Agent, or Firm* — Vista IP Law Group, LLP

(57) ABSTRACT

Disclosed are methods, systems, and articles of manufacture for implementing a floorplan with virtual hierarchies and figure groups for an electronic design. These techniques identify a plurality of layout circuit component designs in a layout and identify or create a figure group at a virtual hierarchy for the plurality of layout circuit component designs. The figure group can be modified into a modified figure group in response to a request for a modification of the figure group. At least one layout circuit component design of the plurality of layout circuit component designs can then be reinstalled into the modified figure group to fulfill the request for modification of the figure group.

20 Claims, 22 Drawing Sheets

(56) References Cited

U.S. PATENT DOCUMENTS

| | | |
|---|---|---|
| 2005/0138591 A1 | 6/2005 | Shirai |
| 2006/0218156 A1 | 9/2006 | Schechinger |
| 2009/0199143 A1 | 8/2009 | Schlotman |
| 2011/0107281 A1 | 5/2011 | Sun |
| 2011/0191303 A1 | 8/2011 | Kaufman |
| 2012/0054699 A1* | 3/2012 | Cho et al. ........... G06F 17/5068 716/102 |
| 2013/0187941 A1 | 7/2013 | Noon |
| 2014/0177940 A1 | 6/2014 | Nakagaki |
| 2015/0269297 A1 | 9/2015 | Tuan |
| 2015/0339430 A1* | 11/2015 | Nifong et al. ...... G06F 17/5072 716/112 |
| 2015/0363478 A1 | 12/2015 | Haynes |
| 2017/0235848 A1 | 8/2017 | Van Dusen |

OTHER PUBLICATIONS

Notice of Allowance dated Apr. 23, 2018 for U.S. Appl. No. 15/282,739.

Notice of Allowance dated May 1, 2018 for U.S. Appl. No. 15/282,778.

Final Office Action dated May 30, 2018 for U.S. Appl. No. 15/199,903.

Non-Final Office Action dated Jun. 15, 2018 for U.S. Appl. No. 15/283,042.

NA9109385, "Design Extensions to Contents View", IBM Technical Disclosure Bulletin, Sep. 1991, vol. 34, No. 4A, pp. 385-388 (4 pages).

* cited by examiner

408K 406K
404K
402K

402N

METHODS, SYSTEMS, AND COMPUTER PROGRAM PRODUCT FOR IMPLEMENTING A FLOORPLAN WITH VIRTUAL HIERARCHIES AND FIGURE GROUPS FOR AN ELECTRONIC DESIGN

CROSS REFERENCE TO RELATED U.S. PATENT APPLICATIONS

This Application is related to U.S. patent application Ser. No. 15/199,903 entitled "METHODS, SYSTEMS, AND COMPUTER PROGRAM PRODUCT FOR IMPLEMENTING AN ELECTRONIC DESIGN BY MANIPULATING A HIERARCHICAL STRUCTURE OF THE ELECTRONIC DESIGN" and filed on Jun. 30, 2016, U.S. patent application Ser. No. 15/282,739 entitled "METHODS, SYSTEMS, AND COMPUTER PROGRAM PRODUCT FOR IMPLEMENTING ENGINEERING CHANGE ORDERS WITH FIGURE GROUPS AND VIRTUAL HIERARCHIES", U.S. patent application Ser. No. 15/282,778 entitled "METHODS, SYSTEMS, AND COMPUTER PROGRAM PRODUCT FOR IMPLEMENTING SYNCHRONOUS CLONES FOR AN ELECTRONIC DESIGN", U.S. patent application Ser. No. 15/283,052 entitled "METHODS, SYSTEMS, AND COMPUTER PROGRAM PRODUCT FOR IMPLEMENTING LEGAL ROUTING TRACKS ACROSS VIRTUAL HIERARCHIES AND LEGAL PLACEMENT PATTERNS", U.S. patent application Ser. No. 15/283,042 entitled "METHODS, SYSTEMS, AND COMPUTER PROGRAM PRODUCT FOR DYNAMICALLY ABSTRACTING VIRTUAL HIERARCHIES FOR AN ELECTRONIC DESIGN", and U.S. patent application Ser. No. 15/283,081 entitled "METHODS, SYSTEMS, AND COMPUTER PROGRAM PRODUCT FOR IMPLEMENTING DYNAMIC MANUVERS WITHIN VIRTUAL HIERARCHIES OF AN ELECTRONIC DESIGN". The contents of the aforementioned U.S. patent applications are hereby expressly incorporated by reference for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Modern electronic designs often include various cells such as some off-the-shelf configurable or non-configurable library cells, intellectual property (IP) cells, macro cells, etc. Each of these cells may be instantiated multiple times as instances in an electronic design so that when a designer desires or requires to make a change to this cell, the designer only needs to make the change once, and all the change will be automatically reflected in all the instances in the electronic design to save development efforts and to expedite the design cycles so as to shorten the time-to-market of the eventual products.

Conventional electronic design implementations include a top-down and a bottom-up approach. A top-down approach begins the implementation process at the top or highest hierarchy and proceeds to lower hierarchies until it reaches the lowest hierarchy to complete an IC design. With the top-down approach, the functional cells at a higher hierarchy may be brought into the layout canvas while each cell include its own pins, ports, or terminals (collectively pin for singular or pins for plural hereinafter). The details of these functional cells at lower hierarchies are not yet exposed and will be designed at respective lower hierarchies as the top-down approach migrates to lower hierarchies. As a result of the non-exposure or unavailability of lower hierarchies (e.g., the lower hierarchies have not yet been implemented), a circuit designer working on a higher hierarchy may need to estimate the size of each cell and guess or guesstimate the locations of pins or terminals for the cell. The estimated cell may be too big to waste invaluable space on silicon or may be too small to accommodate all the devices therein.

In addition to the manual efforts to create the location, identification, etc. for a pin of a cell, these guesstimated pin or terminal locations unlikely to be optimal for connecting with the pins or ports of the devices within the cell. Either way, multiple iterations may be required for even a single cell. In addition, even if the circuit designer knows how these pins are connected to each other, the circuit designer may only align or offset these pins by manipulating the cell. In the event that a designer groups a set of components or cells and intends to create a logical cell for the set, the pins of the logical cell or their identifications thereof (e.g., names of the pins) have to be manually created. The designer will then have to find the corresponding pin identifications in the schematic design and associated these manually created identifications with the corresponding pin identifications.

Bottom-up approaches begin with the design of discrete circuit components and proceed to higher hierarchies as the designs of lower hierarchies are complete until the design for the top or highest hierarchy is complete. In these bottom-up approaches, pins and their identifications as well as locations are determined at lower hierarchies in their respective cells. At the higher hierarchies, these pins often present a challenge to routing these pins of an actual or virtual cell because these pins are determined individually for each cell and independent of each other and may thus cause misalignment of pins or terminals at higher hierarchies where these cells are assembled and supposed to be interconnected. To rectify these problems such as pin or terminal misalignment at higher hierarchies, the design process must return to the lower hierarchies where the devices with the misaligned pins are placed, adjust the placement of the devices, and determine whether the pins or terminals are aligned at the next higher hierarchy. These conventional approaches must then proceed to the next higher hierarchy to determine whether there exist other misalignment problems. These conventional approaches may thus iterate multiple times until an acceptable or desirable solution is found. Therefore, there is a need for a better approach to manipulate the hierarchies of an electronic design to effectively and efficiently create a cell for a group of devices.

The problem is exacerbated during the prototyping, floorplanning, placement stage or during the implementation of a portion of an electronic design where no existing IP cells or blocks are available. For example, a designer may be implementing a portion of the design corresponding to a new design for which no existing cells or blocks are available. As another example, a designer may then need to lay out this portion by placing individual components. The design may then need to create one or more cells or blocks for these newly inserted layout components either because of a design requirement or because of a desire or need for reducing the complexity in the appearance of the layout. In these embodiments, the designer may first place a plurality of layout components in a layout and attempt to create one or more cells for the plurality of layout components.

Moreover, many of these layout components may need to be moved or modified to fit various design requirements during these stages. Some conventional approaches group the selected layout components into a cell but do not add any connectivity to such a cell. For example, a cell created by these conventional approaches may have no ports, pins, or terminals to connect to the remaining portion of the electronic design to which this newly created cell belongs. Some conventional approaches attempt to rectify this shortcoming by requiring manual creation of the boundary as well as manual determination of various connections (e.g., pins, terminals, ports, etc.) along the manually created boundary. These conventional approaches invariably involve some guesstimates and hence a number of iterations to finally create the cell with usable connections along the boundary of the cell.

Modern electronic design flows often implement their layouts either as flat layouts where layout devices are inserted at a single hierarchical level (and hence flat) or as hierarchical layouts where layout devices are inserted at multiple physical hierarchies. Flat layouts are intuitive to implement but are often cluttered with layout devices scattered across the entire layout, especially when approaching the later stage of the physical implementation process. These individual layout devices in a flat structure are difficult to manipulate, especially during design planning, floorplanning, or feasibility estimate stages that may involve frequently moving layout devices to achieve goals including, for example, better silicon utilization, balanced metal density, etc. Also, layout devices in a flat layout may need to be grouped together for functional purposes. For example, the layout devices of an integrated circuit (IC) chip with a flat layout may need to be placed closely to each other for performance, manufacturing, or reliability purposes. Selecting these individual layout devices in a flat layout may be time consuming and error prone.

Hierarchical layouts are developed to address the shortcomings caused by the flat structure of flat layouts. In the above example of an IC chip having a plurality of layout devices, a hierarchical layout may include the IC chip as a cell or block at a first hierarchical level and the plurality of layout devices in the IC chip at a second hierarchical level below the first hierarchical level. This grouping of layout devices into cells or blocks at various hierarchical levels may resolve the aforementioned problems with selecting and manipulating the IC chip in a hierarchical level because the entire IC cell or block may be selected at once, and all the plurality of layout devices belong to this IC cell or block will be automatically selected. Nonetheless, hierarchical layouts have their own shortcomings. For example, when a designer attempts to allocate an area for the IC chip in a populated, hierarchical layout for planning or feasibility study purposes, the designer may often need to resize or reshape the size or shape of the IC chip. With a hierarchical layout, the designer may then need to check out the IC cell with the plurality of layout devices from the hierarchical layout database, edit the contents of the IC cell, save the IC cell upon completion of the edits, and check the IC cell back into the hierarchical layout database. As a result, editing a single cell requires multiple expensive network inputs/outputs (I/Os).

Therefore, there exists a need for methods, systems, and computer program products for implementing a floorplan with virtual hierarchies and figure groups for an electronic design.

SUMMARY

Disclosed are method(s), system(s), and article(s) of manufacture for implementing a floorplan with virtual hierarchies and figure groups for an electronic design in one or more embodiments. Some embodiments are directed at a method for implementing a floorplan with virtual hierarchies and figure groups for an electronic design.

In some embodiments, these techniques identify a plurality of layout circuit component designs in a layout and identify or creating a figure group at a virtual hierarchy for the plurality of layout circuit component designs. The figure group may be modified into a modified figure group in response to a request for a modification of the figure group. At least one plurality layout circuit component design of the layout circuit component designs may then be reinstalled into the modified figure group to fulfill the request for modification of the figure group.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
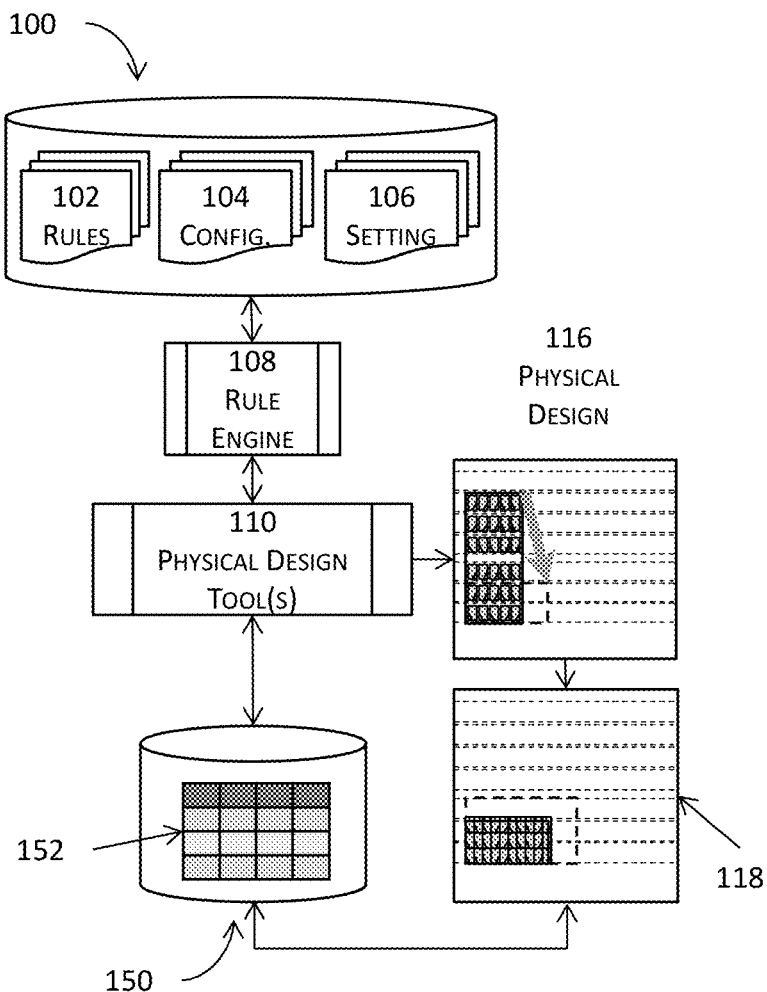
FIG. 1 illustrates a high level block diagram of a simplified system for implementing a floorplan with virtual hierarchies and figure groups for an electronic design in one or more embodiments.

Various techniques are directed to implementing a floorplan with virtual hierarchies and figure groups for an electronic design in various embodiments. In some embodiments, a physical implementation tool (e.g., a design planning tool, a floorplanner, etc.) may create a layout (e.g., a floorplan) by inserting each layout circuit component design corresponding to a schematic circuit component design into a flat layout. These techniques may further generate virtual hierarchies for the layout according to the schematic hierarchies of the schematic design in some embodiments. In some other embodiments, virtual hierarchies may be created at the time figure groups or virtual blocks or cells (collectively figure groups) are created in the layout, and these virtual hierarchies at which the figure groups are located exhibit a one-to-one correspondence with the schematic hierarchies of the schematic design.

These techniques may further maintain the binding information between schematic circuit component designs and their corresponding layout circuit component designs such that each layout circuit component design corresponds to a schematic circuit design component that may further correspond to a schematic master. Nonetheless, no physical hierarchies will be created unless or until it is desired or required to create one or more physical hierarchies in the layout. That is, these techniques maintain the layout as flat as possible until or unless it is desired or required to have a hierarchical layout having multiple physical hierarchies. From the physical design perspective, the layout (e.g., floorplan) may include one physical hierarchy—a flat layout—at the completion of the generation of the layout although the flat layout may also correspond to a plurality of virtual hierarchies that correspond to the schematic hierarchies of the corresponding schematic design.

With a flat layout populated with a plurality of layout circuit component designs or layout devices, one or more figure groups may be created according to the one or more schematic hierarchies of the schematic circuit component designs or schematic devices bound to the plurality of layout circuit component designs or layout devices. It shall be noted that the terms circuit component designs and devices may be used interchangeably throughout this application, and that both may refer to a discrete circuit component design, a block or cell of interconnected multiple circuit component designs, etc. at the schematic abstraction level and the layout abstraction level.

The creation of one or more figure groups also creates one or more virtual hierarchies that correspond to one or more schematic hierarchies of the schematic devices bound to the plurality of layout devices. For example, a first schematic cell instance may include a number of schematic devices and a second schematic cell instance having a plurality of schematic devices. The corresponding layout may thus be populated with layout devices of the number of schematic devices as well as the plurality of layout devices in the second schematic cell instance. In this example, a first figure group at a first virtual hierarchy may be created for the layout devices corresponding to the first schematic cell, and a second figure group may be created at a second virtual hierarchy below the first virtual hierarchy for the layout devices in the second schematic cell instance.

In creating a figure group for a plurality of layout devices, these techniques no longer need to identify each of the plurality of layout devices individually as conventional approaches do. Rather, these approaches may identify the plurality of layout devices by using the highest level schematic device to identify lower level schematic devices belonging to this highest level schematic device and by using these lower level schematic devices to select their corresponding layout devices. For example, to create a figure group for a plurality of layout devices of an IC chip in a layout, these techniques may identify the schematic cell instance corresponding to the IC chip and use the identified schematic cell instance to identify the schematic devices within this schematic cell instance. The plurality of layout devices for the IC chip may then be selected by selecting all the layout devices bound to the schematic devices.

A figure thus created provides all the functionalities of a physical cell or block in a hierarchical layout and can be manipulated (e.g., edited) in an identical or substantially similar manner, without the overhead of the physical cell or block. For example, a figure group in a layout (flat or hierarchical layout) may include or be associated with a boundary object that resembles the physical boundary of a physical cell instance in a conventional hierarchical layout, and this boundary object can be manipulated (e.g., resizing, reshaping, etc.) in the same manner as the physical boundary of a physical cell instance. The layout devices enclosed within a figure group may also be manipulated (e.g., add, remove, rearrange, align, etc.) either independently or as the boundary of the figure group is being manipulated as if a designer were to manipulate a physical cell instance. Nonetheless, unlike conventional approaches, these techniques no longer need to check out and check in various physical cells or blocks in order to access and manipulate the contents of a figure group.

When manipulating a figure group, and the manipulation results in rearrangement of at least one layout device of a plurality of layout devices in the figure group, one or more layout devices of the plurality of layout devices are reinstalled in the figure group. The reinstallation includes removal or deletion of the one or more layout devices from the figure group and reinsertion of the removed or deleted one or more layout devices in the manipulated figure group in some embodiments. In some other embodiments, the reinstallation process does not remove and reinsert one or more layout devices. Rather, the reinstallation process moves one or more layout devices to fit all layout devices into the manipulated figure group. In some embodiments, only the one or more layout devices that are affected by the manipulation of the original figure group are reinstalled in the manipulated figure group. In some other embodiments, all layout devices in the original figure group are removed and reinserted into the manipulated figure group. For example, if the boundary of a figure group is resized or reshaped into a modified boundary such that the region occupied by five layout devices in the original figure group disappears, these five layout devices within the original boundary are removed from the figure group and subsequently reinserted into the manipulated figure group in the former embodiments. In the latter embodiments, all the layout devices are removed from the original figure group and subsequently reinserted into the manipulated figure group.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

FIG. 1 illustrates a high level block diagram of a simplified system for implementing a floorplan with virtual hierarchies and figure groups for an electronic design in one or more embodiments. In these embodiments, these one or more layout tools 110 may be further coupled to a rule engine 108 that accesses a set of rules 102, a set of configurations 104, and/or a set of settings 106 stored in a persistent or transient non-transitory computer readable storage medium 100 to generate and modify a physical design such as a floorplan or a layout of an integrated circuit (IC) design based in part or in whole upon the applications of the set of rules, configurations, and/or settings.

In operation, the one or more layout tools 110 may invoke the rule engine 108 to apply a set of rules (102), configurations (104), and/or settings (106) to generate or modify the physical electronic design. For example, the one or more layout tools 110 may generate or open a physical design 116 that includes a plurality of shapes. These one or more layout tools 110 may generate a figure group located at a virtual hierarchy for a set of layout devices or identify an existing figure group comprising the set of layout devices in the physical design 116. Upon receiving a request (e.g., a request from a user) to adjust the shape or size of the figure group, these one or more physical design tools 110 may modify the boundary object of the figure group into a modified boundary object according to the request and reinstall at least one layout device of the set of layout devices into the modified boundary object to create the modified physical design 118. Information about the physical design 116, the modified physical design 118, the original figure group, the original boundary object, the modified figure group, the modified boundary object, or any other pertinent information may then be maintained at a data structure 152 on a persistent or transient non-transitory computer readable storage medium 150.

Figure 2:
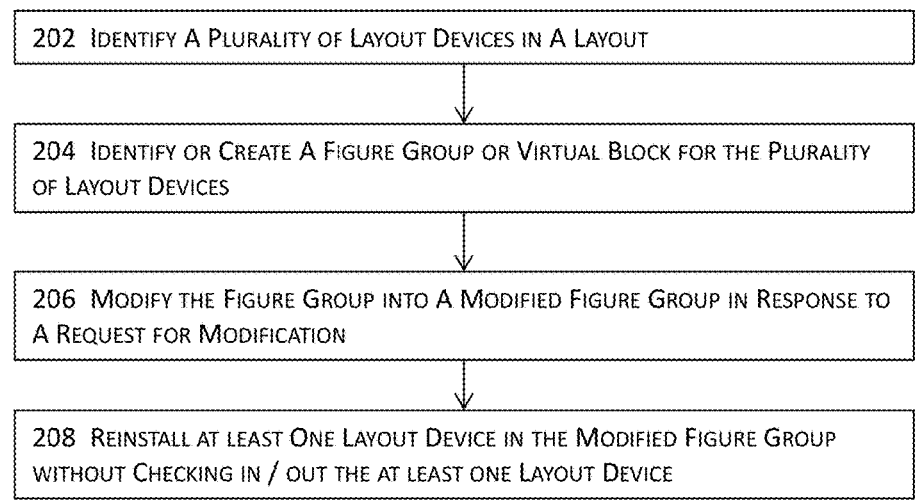
FIG. 2 illustrates a high level block diagram for implementing a floorplan with virtual hierarchies and figure groups for an electronic design in one or more embodiments.

FIG. 2 illustrates a high level block diagram for implementing a floorplan with virtual hierarchies and figure groups for an electronic design in one or more embodiments. In these embodiments, a plurality of layout devices or layout circuit component designs may be identified at 202 from a layout. It shall be noted that the terms "layout device" and "layout circuit component design" may be used interchangeably throughout this application and may include a discrete physical circuit component design (e.g., a geometric shape) or a block, cell, or group of physical circuit component designs.

A virtual block or a figure group (collectively figure group) may be identified, if already existing, or created, if not yet existing, for the plurality of layout devices at 204. For example, if the plurality of layout devices already belong to a figure group, this figure group may be identified at 204. Otherwise, these techniques may create a figure group for the plurality of layout devices by determining a boundary object of a rectilinear shape (e.g., a rectangular bounding box object) based on the plurality of layout devices and enclosing the plurality of layout devices within the boundary object. In these embodiments, a boundary object includes a software programming language mechanism for binding data (e.g., data about vertices, boundary segments, locations thereof, etc. of a boundary of a figure group) with one or more methods that operate on the data and, in the object oriented programming paradigm, may be an instance of a class and may further comprise one or more variables, functions, and/or data structures.

When a figure group is created, the plurality of layout devices enclosed by the boundary of the figure group may thus be represented as an abstract representation (e.g., a rectangular box matching the boundary of the figure group) in the layout. Therefore, the creation of the figure group logically creates a virtual hierarchy in the layout. A virtual hierarchy exists only logically but does not alter the physical hierarchical structure of a layout. As a result, in some embodiments where the layout is a flat layout having a virtual hierarchy, the physical hierarchical structure of the layout remains flat, but the layout logically appears to include one additional hierarchy (the virtual hierarchy) under the top physical hierarchy or the single hierarchy of a flat layout of an electronic design. Therefore, virtual hierarchies do not alter the physical hierarchical structure of a layout as the layout is referenced in a physical design database unless and until the virtual hierarchies are materialized into physical hierarchies. More details about figure groups are described in the U.S. patent applications listed in the Cross Reference to Related U.S. Patent Applications section and expressly incorporated by reference herein for all purposes.

The figure group identified or created at 204 may be modified at 206 into a modified figure group in response a request for modification. The request for modification may be initiated by, for example, a designer in some embodiments or by an EDA (electronic design automation) tool session and may include a variety of modifications to the figure group. For example, the size or shape of the boundary object of the figure group, the contents of the figure group, and/or the arrangement of the plurality of layout devices in the figure group may be the subject of modification of the request. In some embodiments, the designer issues the request by modifying the boundary object of the figure group although one or more layout editors or floorplanner may initiate the modification of the boundary object in some other embodiments.

It shall be noted that the plurality of layout devices may be arranged in the layout with or without regard to pertinent designs rules. For example, the plurality of layout devices may be inserted into the layout without proper alignment or without observing spacing rules for quick feasibility evaluation in some embodiments. Therefore, the figure group created for the plurality of devices may or may not necessarily constitute a legal device pattern satisfying all the pertinent design rules. Similarly, a modification to the figure group may or may not comply with the pertinent design rules. Therefore, the modified figure group at 206 may violate one or more design rules.

For example, some of the plurality of layout devices may even overlap each other in response to a resizing or reshaping modification to the boundary object of a figure group. In some embodiments where satisfying one or more pertinent design rules is required or preferred, these techniques may automatically arrange the plurality of devices in the figure group to satisfy these one or more pertinent design rules when implementing a modification to the figure group although the modification may or may not be necessarily related to any of such design rules. For example, these techniques may align misaligned layout devices in a figure group when the request merely constitutes a modification of the shape or size of the figure group.

In response to the modification, one or more layout devices may be reinstalled into the modified figure group at 208. Reinstallation of a layout device into a figure group includes removing or deleting the layout device from the original figure group and reinserting the layout device at the same or a different location into the modified figure group. In some embodiments, all of the plurality of layout devices may be reinstalled into the modified figure group. In some other embodiments, only one or more layout devices but not all the plurality of layout devices are reinstalled into the modified figure group. For example, when the shape of the boundary object of a figure group is altered, one or more layout devices occupying a region that disappears due to the modification of the figure group may be reinstalled into the modified figure group in some embodiments.

As a working example, a designer may alter the size and shape of the figure group during the planning stage of creating a floorplan. With conventional approaches, a designer either needs to select the plurality of layout devices individually from a flat layout or check out the physical cell instance including the plurality of layout devices from the hierarchical layout database to gain access to the physical cell instance. These techniques described herein address these shortcomings by leveraging figure groups and virtual hierarchies. Figure groups and virtual hierarchies resemble their physical counterparts (physical cells or blocks and physical hierarchies) and thus provide all the advantages of physical cells or blocks and physical hierarchies but without the disadvantages of their physical counterparts because figure groups and virtual groups exist logically until and unless they are materialized.

In the aforementioned example of resizing or reshaping the figure group, the designer may simply change the shape or size of the boundary object of the figure group into a modified boundary object, and these techniques automatically reinstall one or more layout devices in the modified boundary object. The designer thus no longer needs to manually select the plurality of layout devices individually from a flat layout or check out the layout cell instance from a hierarchical layout database of a hierarchical layout as conventional approaches do. Rather, the designer may simply modify the boundary object (e.g., by dragging a corner of the boundary object to change its size or shape) as the designer would for a physical cell instance in a conventional hierarchical layout. Unlike with the conventional approaches, the designer no longer needs to check out the physical cell instance from the hierarchical layout database and check it back in after the completion of the modification. These techniques described herein thus conserve the consumption of computational resources by saving at least the expensive network roundtrips to access the hierarchical layout database.

Figure 3A:
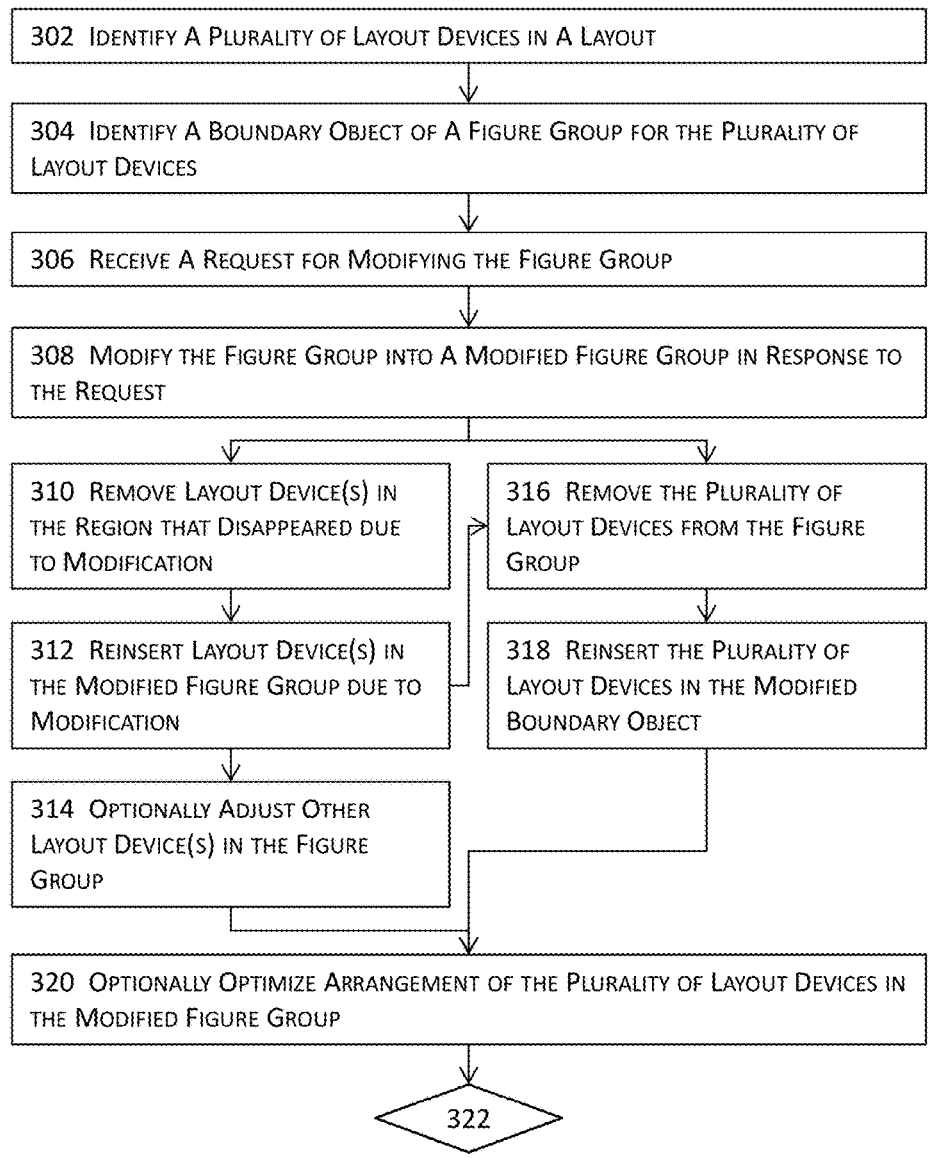
FIGS. 3A-3B jointly illustrate a more detailed block diagram for implementing a floorplan with virtual hierarchies and figure groups for an electronic design in one or more embodiments.
Figure 3B:
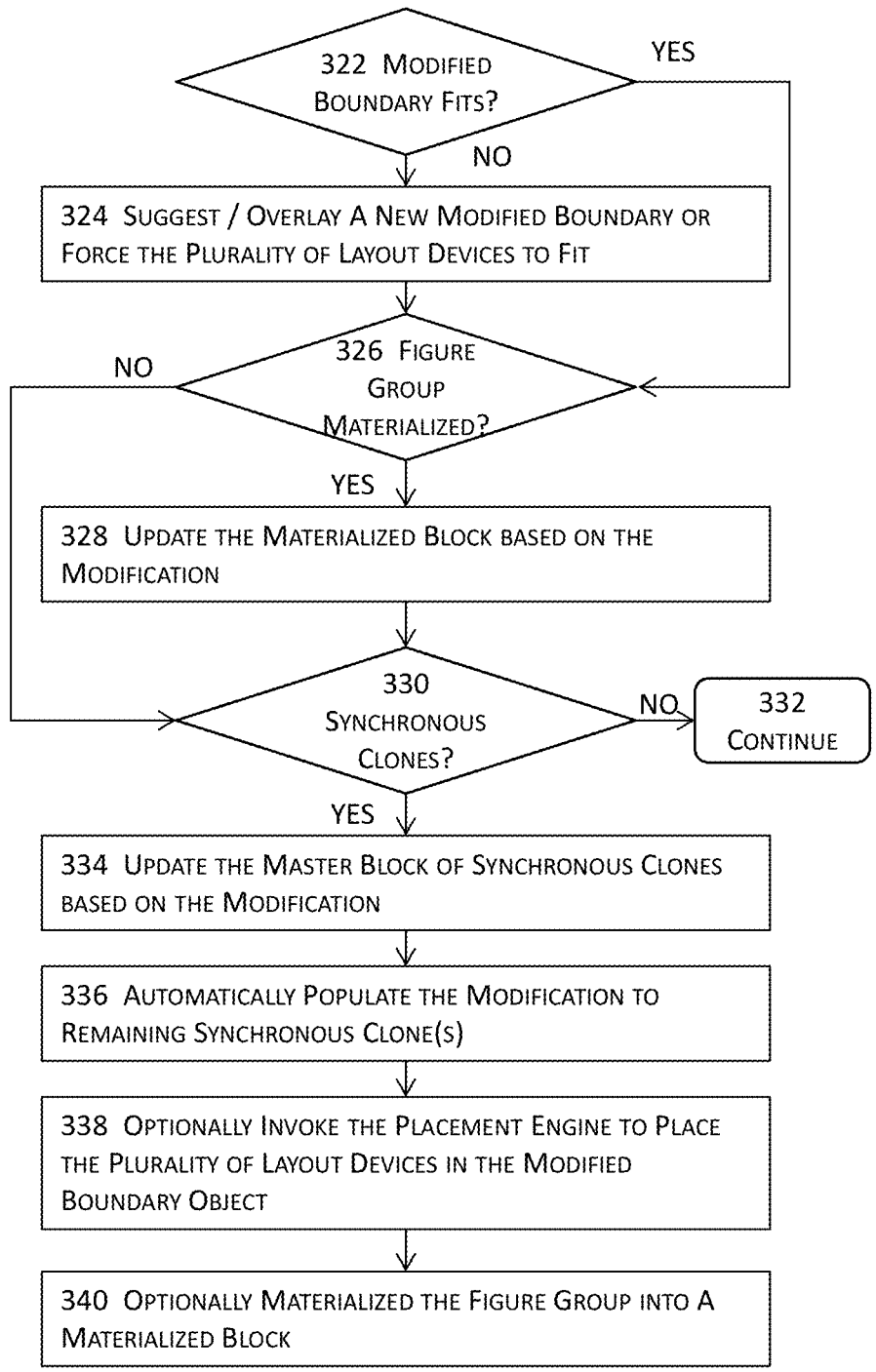

FIGS. 3A-3B jointly illustrate a more detailed block diagram for implementing a floorplan with virtual hierarchies and figure groups for an electronic design in one or more embodiments. In these embodiments, a plurality of layout devices in a layout may be identified at 302. The layout may be a flat layout having only one hierarchical level in some embodiments or a hierarchical layout comprising multiple physical hierarchies in some other embodiments.

In some embodiments where the plurality of layout devices do not belong to a figure group, a boundary object may be identified, and a figure group may be created with the boundary object to enclose the plurality of layout devices at 304. In some other embodiments where the plurality layout devices already belong to a figure group, the boundary object in the sense of object-oriented programming of the plurality of layout devices may be identified at 304.

A request for modifying the figure group or contents thereof may be received at an EDA tool session at 306. For example, the request may include one or more operations to resize or reshape the size or shape of the figure group. The request may be initiated by a user or by the EDA tool session. The EDA tool session may then perform the operations to modify the figure group at 308 into a modified figure group. In the aforementioned example, the EDA tool session may then resize or reshape the boundary object of the figure group to fulfill the request.

The flow diagram illustrated in FIG. 3A may then bifurcate into two branches. In some of these embodiments illustrated in FIG. 3A, one or more layout devices may be removed at 310 from at least a region that disappeared due to the modification of the figure group. In some of these embodiments, one or more layout devices in the region that disappeared due to the modification plus one or more other layout devices in the remainder of the figure group may be removed from the figure group at 310. It shall be noted that in some other embodiments, these techniques may not necessarily remove layout devices from a figure group during reinstallation. Rather, these techniques may simply move the locations in accordance with the boundary object that is or is being changed for the figure group. For example, these techniques may not remove these one or more layout devices from the disappeared region at 310. Rather, these techniques move these one or more layout devices from their locations in the disappeared region to their respective new locations in the modified boundary object. In some of these embodiments, these techniques may move the one or more layout devices to available space within the modified boundary object without modifying the locations of one or more other layout devices in the non-disappearing region, whereas these techniques may rearrange one or more other layout devices in the non-disappearing region to accommodate the one or more layout devices as described below with reference to 314.

These one or more layout devices may then be reinserted into the modified figure group at 312. The reinsertion may or may not necessarily observe one or more pertinent design rules governing, for example, legality of placement of the plurality of layout devices in the modified figure group. For example, overlaps between layout devices may be permitted in some embodiments. Although overlaps clearly result in design rule violations and non-manufacturability, permitting overlaps (and other types of design rule violations) may serve other design purposes (e.g., design planning, feasibility evaluation, floorplanning, etc.) where a quick evaluation of the outcome outweighs design rule compliance. In some other embodiments where partial removal at 310 and partial reinsertion at 312 do not lead to desired or required results, the flow diagram from proceed from 312 to 316 where all the plurality of layout devices are removed from the original figure group. Furthermore, as described above with reference to 310 immediately above, these techniques may not necessarily remove and reinsert layout devices during reinstallation in response to a modified boundary object of a figure group. Rather, these techniques may move one or more layout devices in the figure group to fit all layout devices within the modified boundary object.

One or more other layout devices in the figure group may be optionally adjusted at 314. In the aforementioned example, one or more other layout devices that are not modified (e.g., removed and reinserted) may be adjusted (e.g., moved to one or more new locations in the modified figure group) at 314 to accommodate the one or more reinserted layout devices due to the modification.

In some other embodiments, the flow diagram may bifurcate from 308 to 310 where all the plurality of layout devices are removed from the original figure group at 316. The plurality of layout devices are then reinserted into the modified figure group at 318. Similar to the reinsertion at 312, the reinsertion at 318 may or may not necessarily observe one or more pertinent design rules. As described above with reference to 310 and 312 above, these techniques may not necessarily remove and reinsert the layout devices during reinstallation in response to a modified boundary object of a figure group. Rather, the plurality of layout devices may be rearranged to fit within the modified boundary object at 316. Similarly, in some embodiments where the plurality of layout devices are rearranged or moved but are not removed, the reinsertion at 318 will not be performed, and the flow diagram proceeds to 320. The bifurcated flow sub-diagrams may then converge to proceed to 320 where the arrangement of the plurality of layout devices in the modified figure group may be optionally optimized. For example, a placement engine may be optionally invoked at 320 to place the plurality of layout devices within the figure group while observing all the pertinent design rules.

A decision may be made at 322 to determine whether the plurality of layout devices fit within the modified figure group. If the determination result is negative, these techniques may suggest, at 324, a new modified boundary object that accommodate the plurality of layout devices or overlay the new modified boundary object with the modified boundary object determined at 308 for the modified figure group in some embodiments. Alternatively, these techniques may, at 324, force all the plurality of layout devices to fit into the modified figure group with or without regard to the pertinent design rules. For example, these techniques may force all the plurality of layout devices into the modified figure group despite some overlaps between the plurality of layout devices.

If the determination result is affirmative at 324, the flow diagram may proceed to 326 to further determine whether the figure group has been materialized into a physical block or cell. If the determination at 326 is affirmative, the materialized block or cell of the figure group may be updated at 328 based in part or in whole upon the modification in the request received at 306. Otherwise, the flow diagram may proceed to 330 to determine whether synchronous clones have been created for the figure group subject to the modification.

If the determination result at 330 is negative, the flow diagram may proceed to 332 to continue with, for example, the physical implementation of the layout, to identify another set of layout devices from the layout to repeat the processes, etc. Otherwise, if it is determined that synchronous clones have been created for the figure group encompassing the plurality of layout devices, the master block or cell of synchronous clones or any synchronous clone belonging to the group of synchronous clones may be updated at 334 based in part or in whole upon the modification from the request or upon one or more derived modifications (e.g., changes in connectivity including virtual or physical hierarchies, nets or net segments, identifications of net segments, pins, ports, terminals, etc. as a result of the modification from the request)

With the updated master block or a synchronous clone, the same modifications may be automatically populated to the remaining synchronous clones at 336 in some embodiments. In some embodiments where a synchronous clone is represented as a reference or an abstract representation (e.g., a boundary object with pins, ports, or terminals along the boundary object but no contents) linked to the group of synchronous clones in the layout and no other contents (e.g., layout devices) are shown in the synchronous clone, updating the master block or a synchronous clone in the group of synchronous clones consumes even less computational resources because this synchronous clone is represented as a reference or an abstract representation whose contents may be retrieved from the master block (or from another articulated synchronous clone) when descending into this abstract representation. More details about synchronous clones are described in U.S. patent application Ser. No. 15/282,778 entitled "METHODS, SYSTEMS, AND COMPUTER PROGRAM PRODUCT FOR IMPLEMENTING SYNCHRONOUS CLONES FOR AN ELECTRONIC DESIGN", the contents of which are hereby expressly incorporated by reference for all purposes.

A placement engine may be optionally invoked at 338 to place the plurality of layout devices within the modified boundary object of the figure group while observing all the pertinent design rules. The invocation of the placement engine to place the plurality of layout devices within the modified figure group results in a legal device pattern that are further described in U.S. patent application Ser. No. 15/283,052 entitled "METHODS, SYSTEMS, AND COMPUTER PROGRAM PRODUCT FOR IMPLEMENTING SYNCHRONOUS CLONES FOR AN ELECTRONIC DESIGN", the contents of which are also hereby expressly incorporated by reference for all purposes.

The figure group may be optionally materialized or detached at 340 into a materialized block or cell (e.g., a physical block or cell), and the materialization of the figure group also materializes the virtual hierarchy at which the figure group is located. As a result, the physical hierarchical structure and the physical layout database, if available, may also be updated to reflect the materialization or detachment of the figure group. More details about figure groups located at one or more virtual hierarchies as well as materialization or detachment thereof are described in U.S. patent application Ser. No. 15/282,778 entitled "METHODS, SYSTEMS, AND COMPUTER PROGRAM PRODUCT FOR IMPLEMENTING SYNCHRONOUS CLONES FOR AN ELECTRONIC DESIGN", the contents of which are also hereby expressly incorporated by reference for all purposes.

Figure 4A:
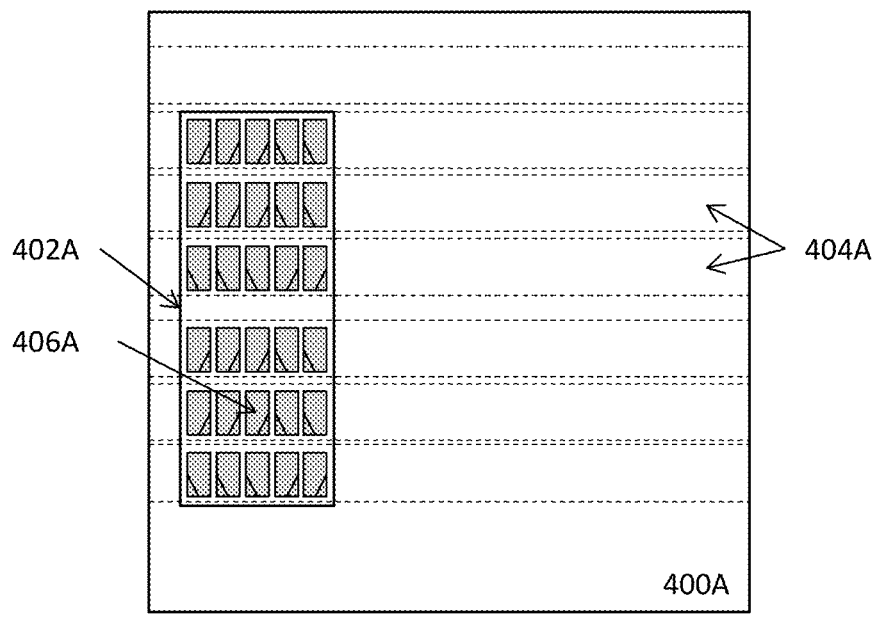
FIGS. 4A-4P illustrate some examples of the application of some techniques for implementing a floorplan with virtual hierarchies and figure groups for an electronic design described herein to simplified portions of electronic designs in some embodiments.
Figure 4B:
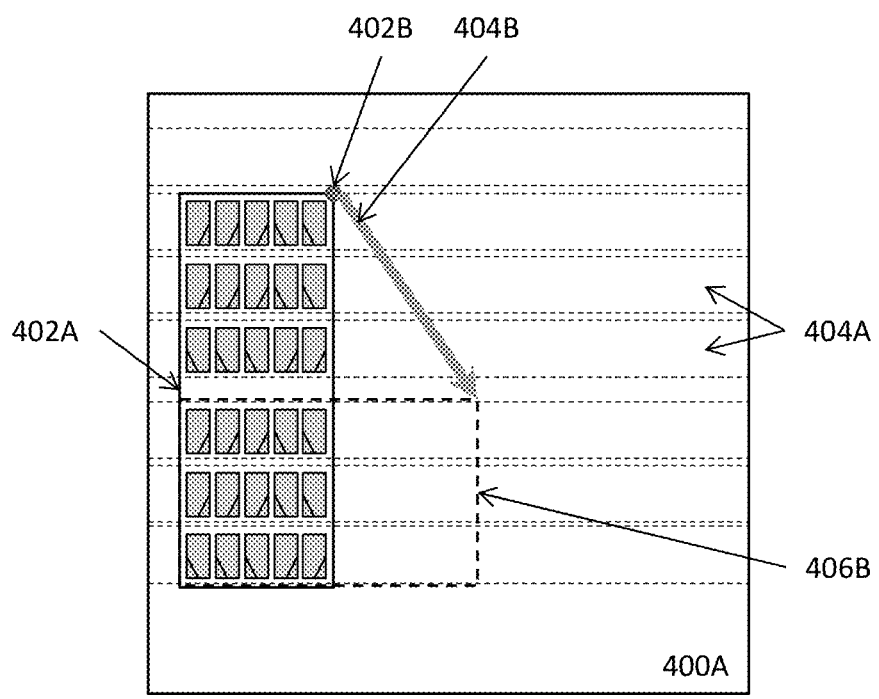
Figure 4C:
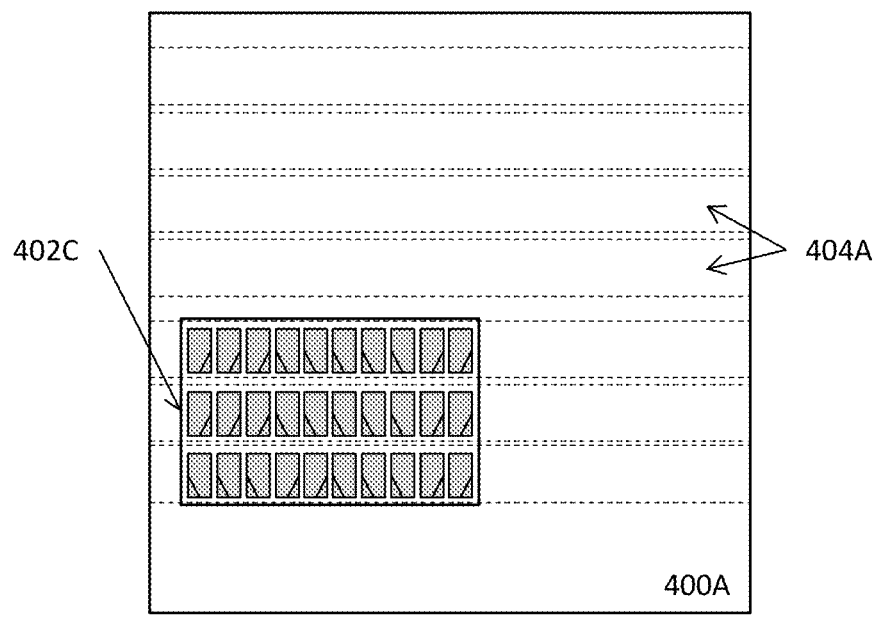
Figure 4D:
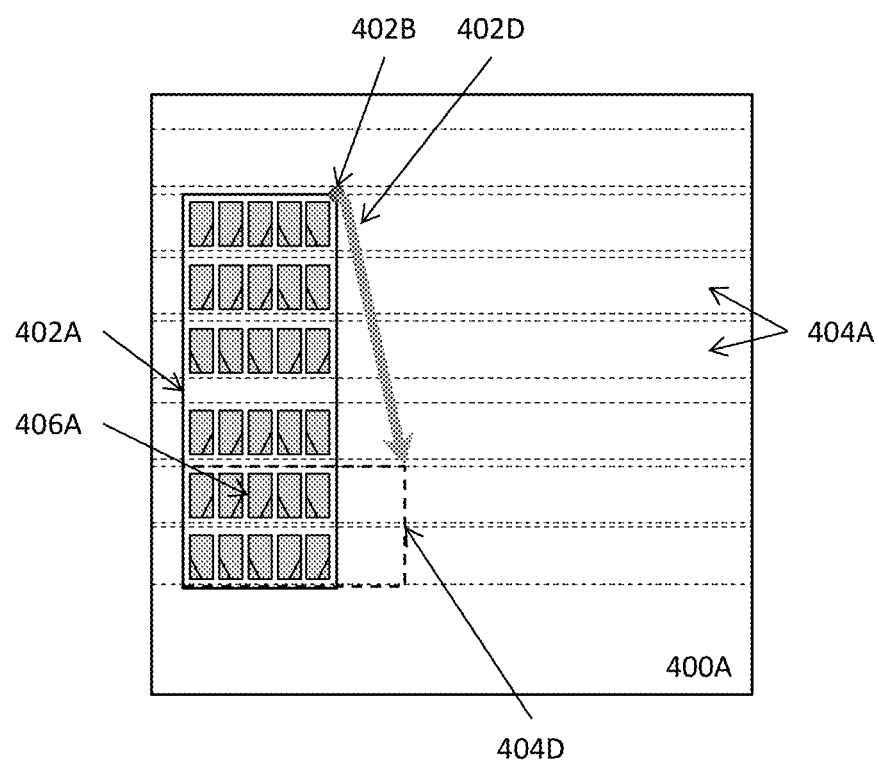
Figure 4E:
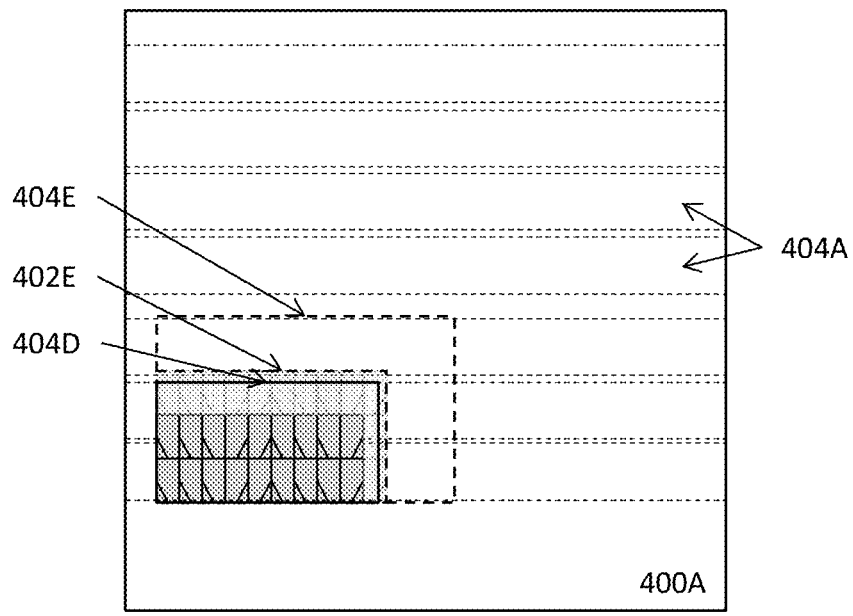
Figure 4F:
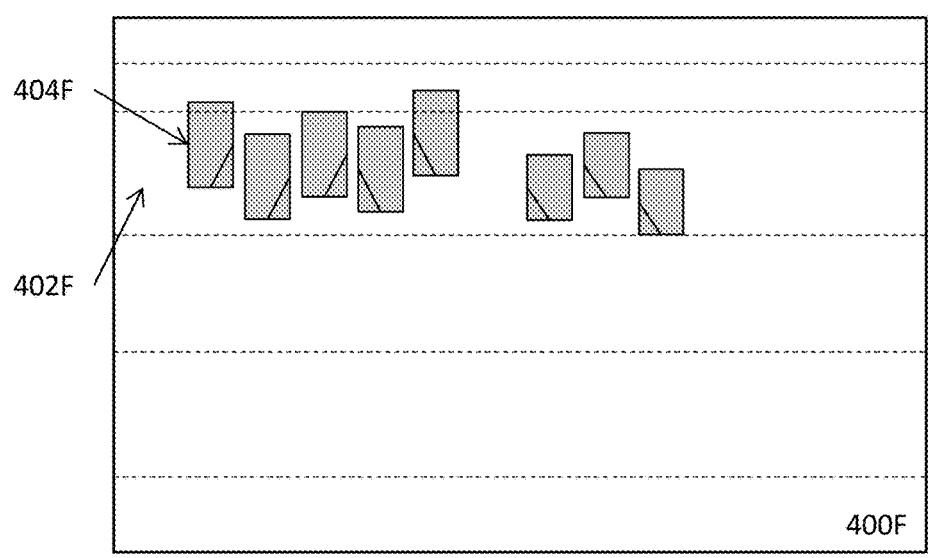
Figure 4G:
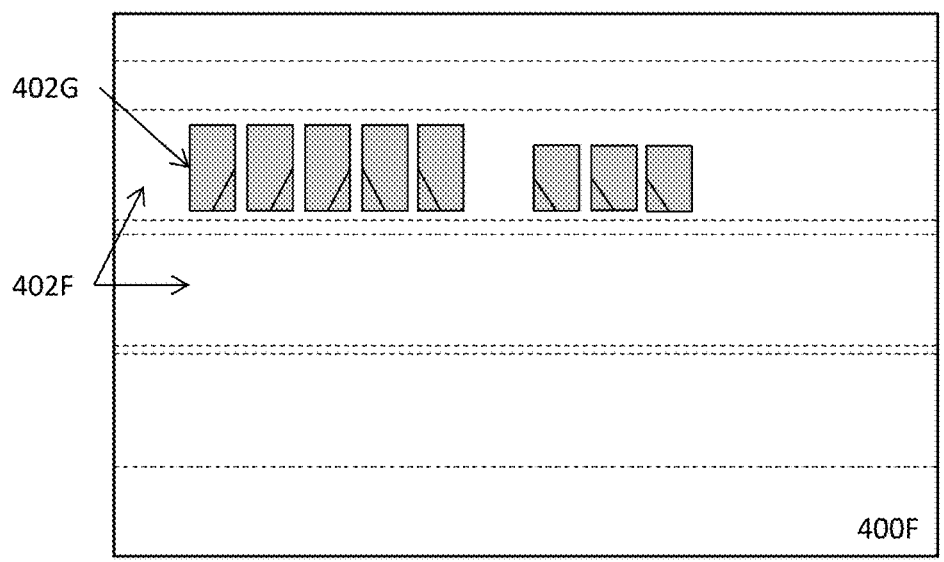
Figure 4H:
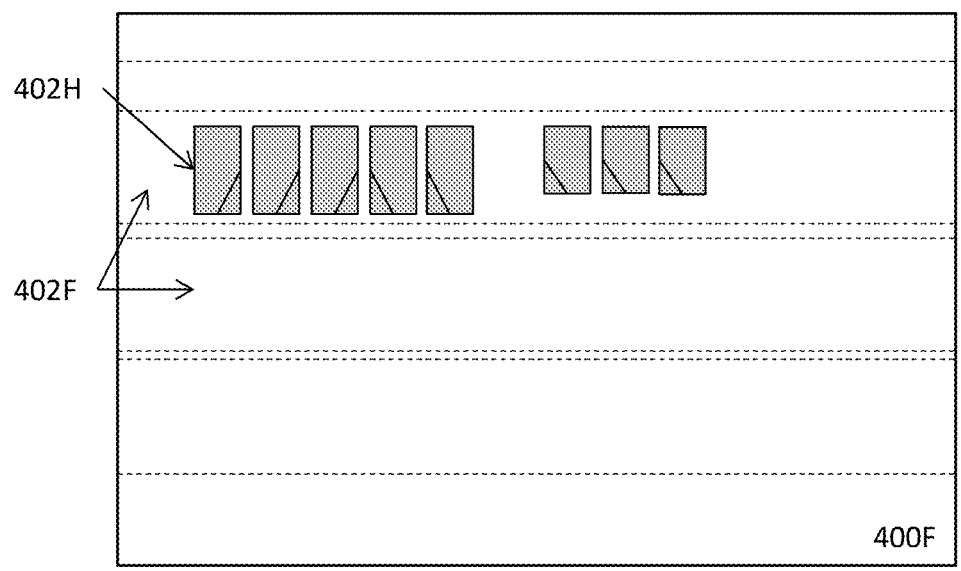
Figure 4I:
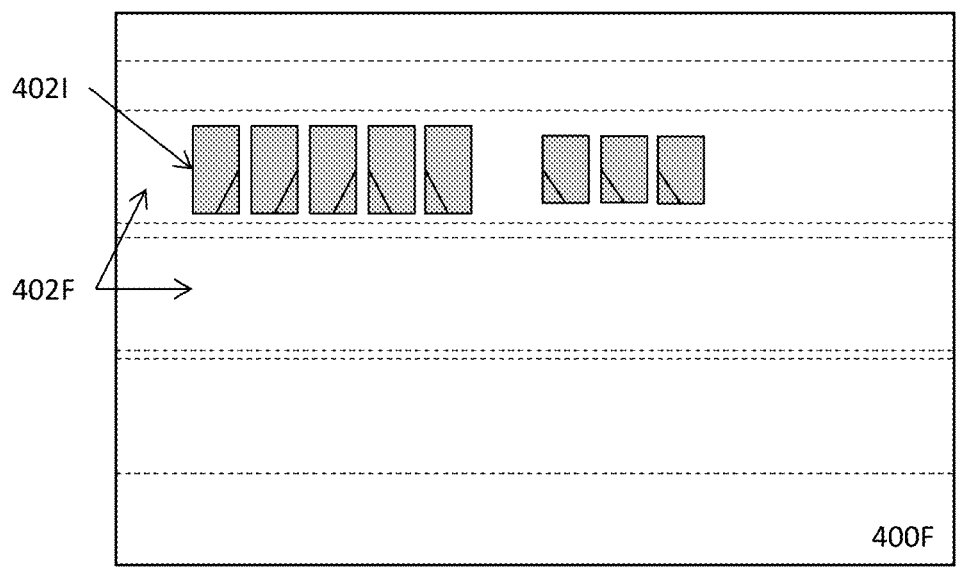
Figure 4J:
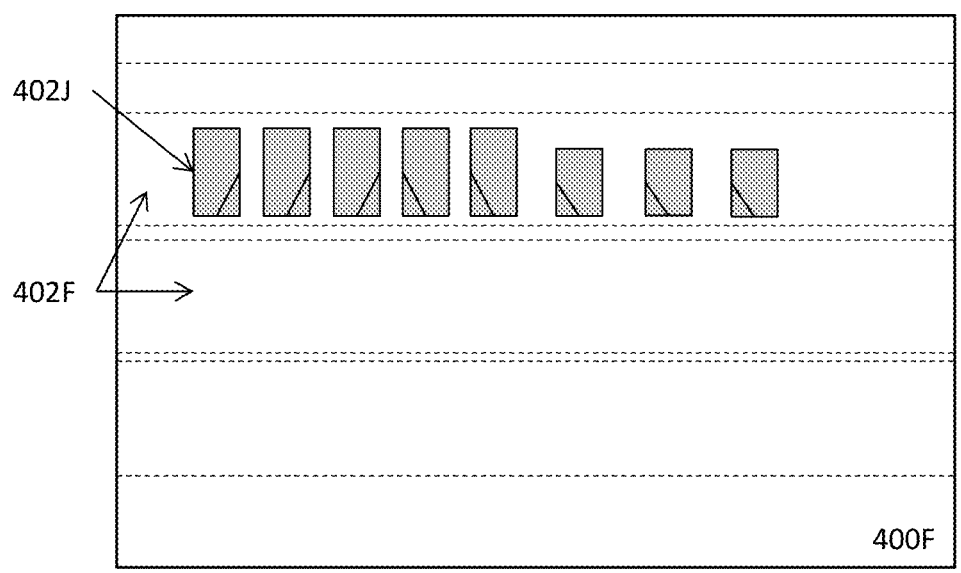
Figure 4K:
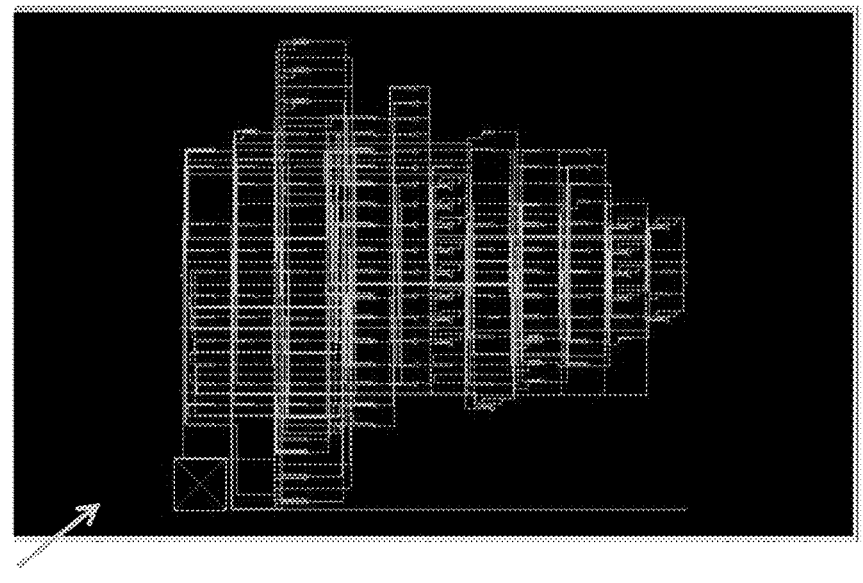
Figure 4K:
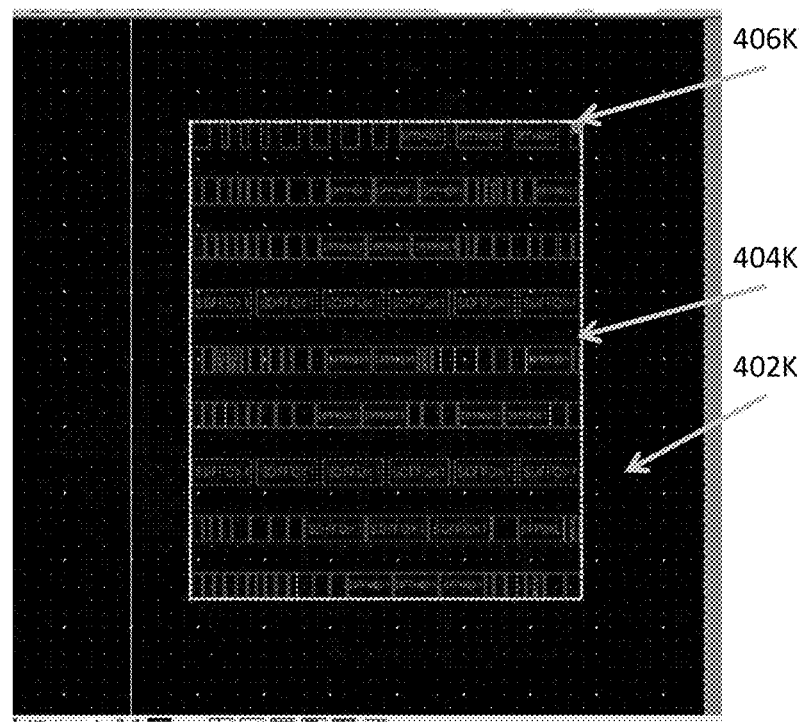
Figure 4L:
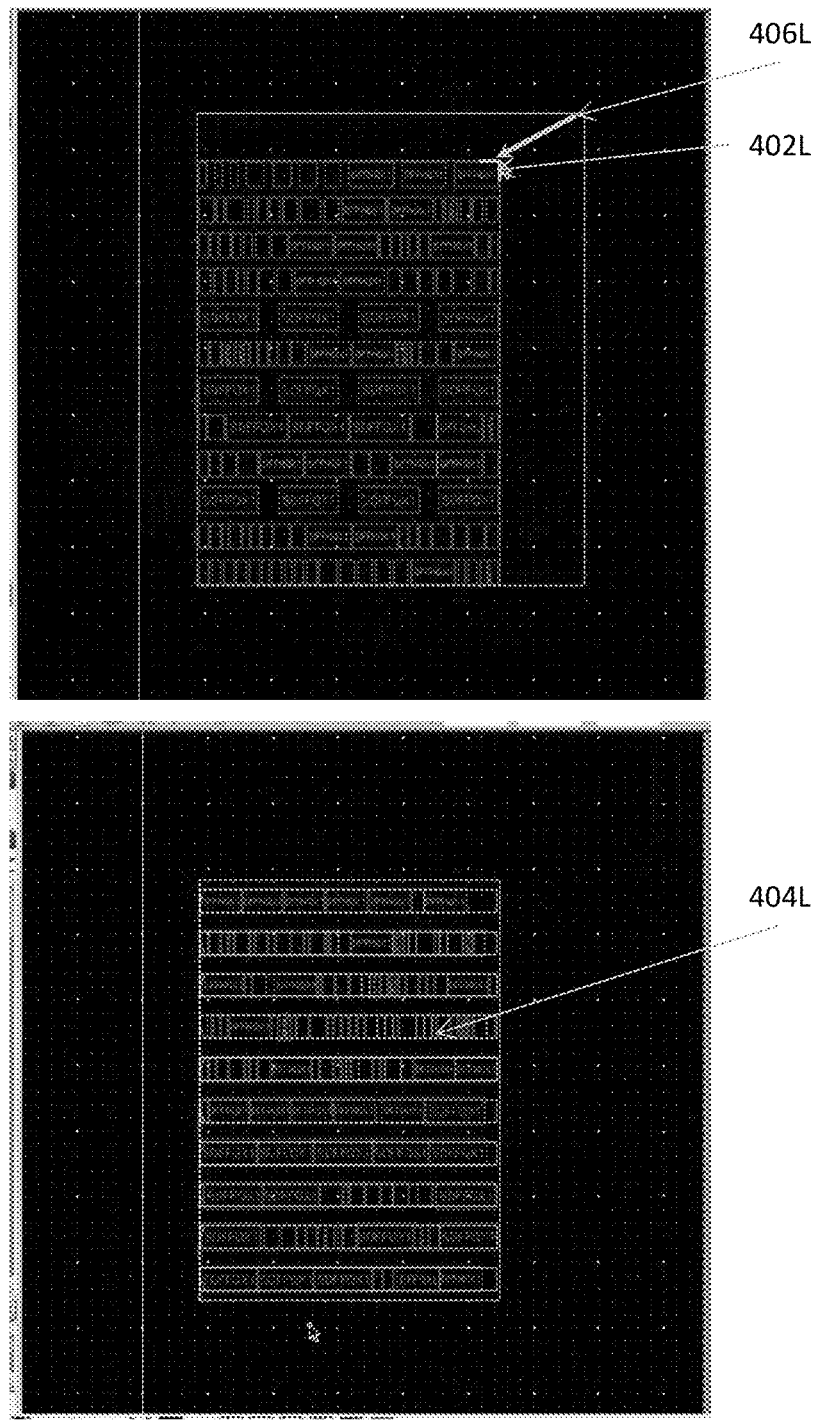
Figure 4M:
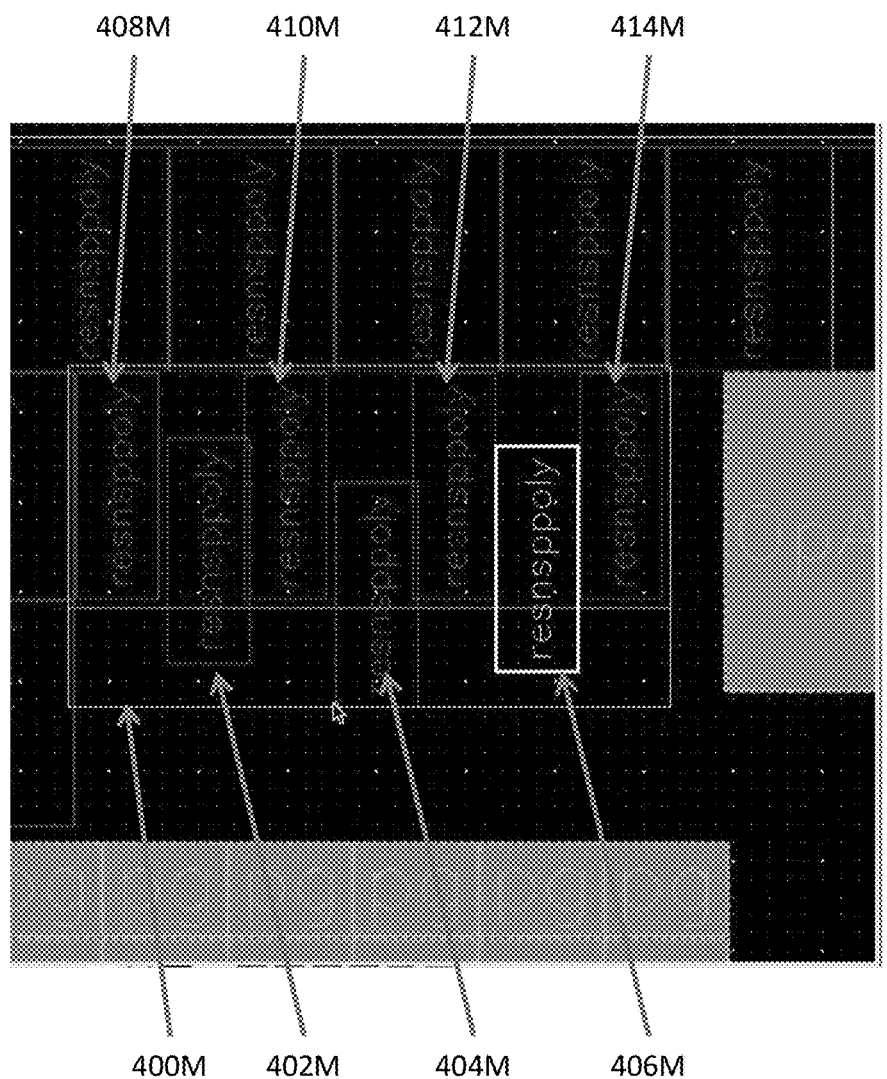
Figure 4N:
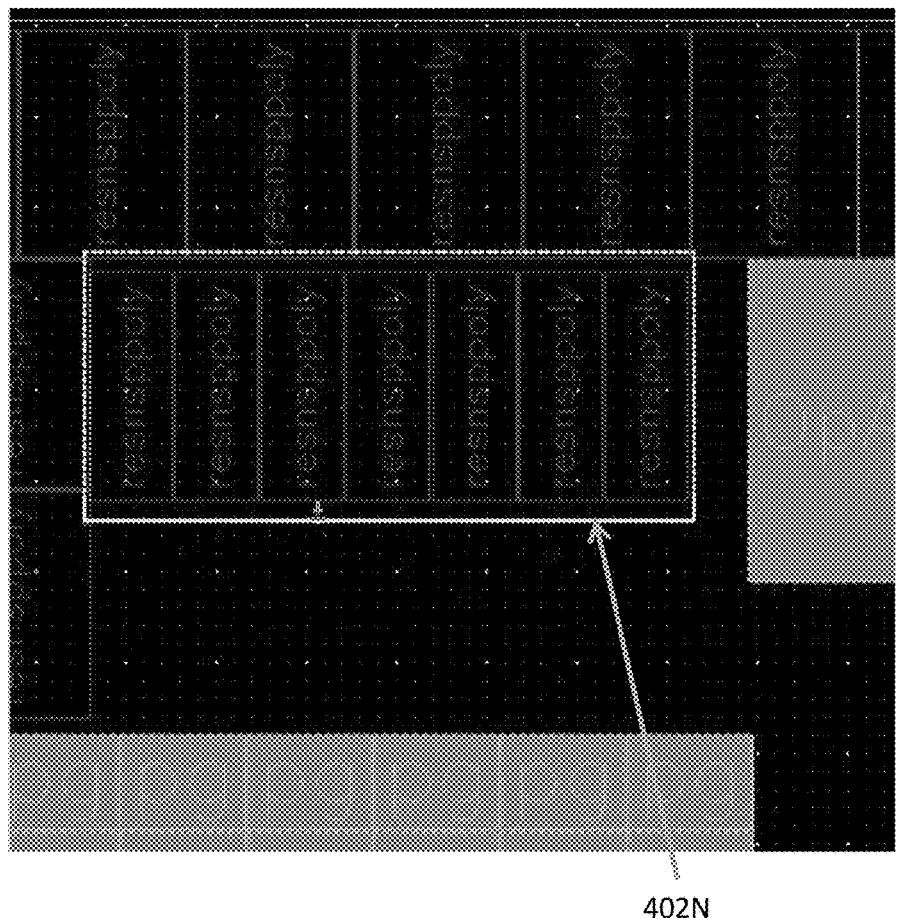
Figure 4O:
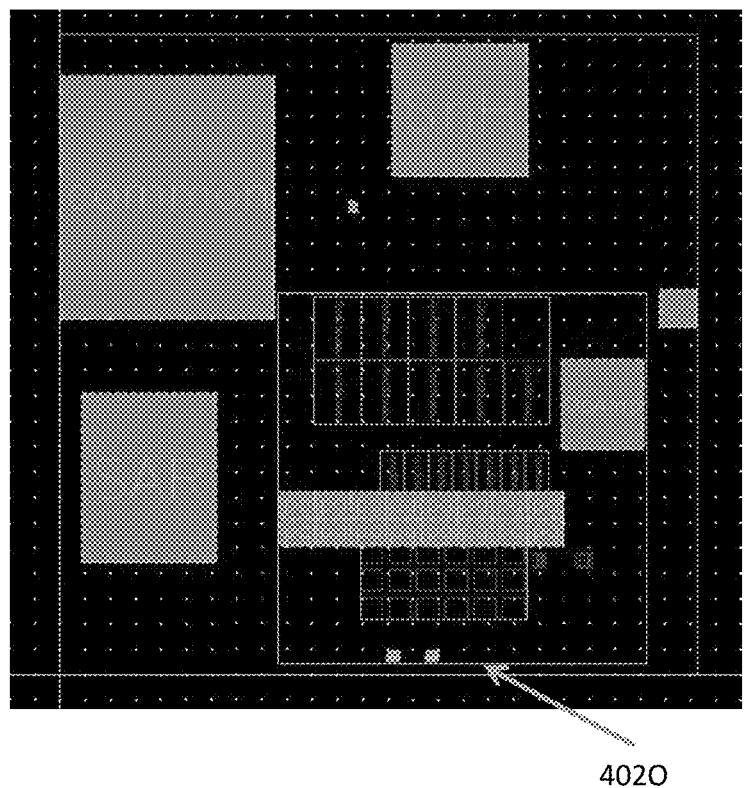
Figure 4P:
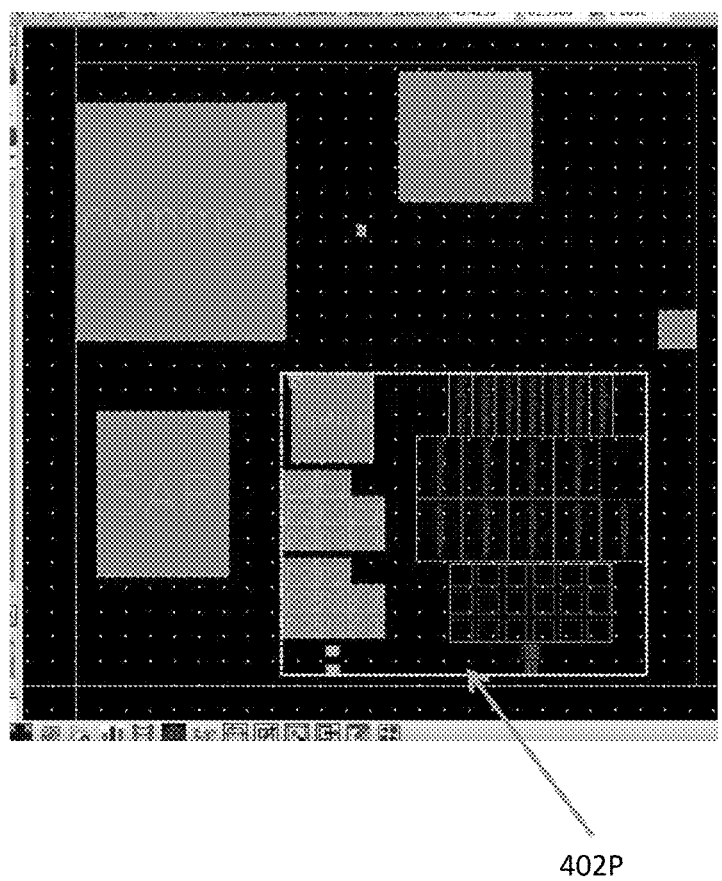

FIGS. 4A-4P illustrate some examples of the application of some techniques for implementing a floorplan with virtual hierarchies and figure groups for an electronic design described herein to simplified portions of electronic designs in some embodiments. FIG. 4A illustrates an example of a layout portion 400A that includes a plurality of layout devices 406A arranged in a plurality of placement rows 404A in a figure group 402A. The figure group 402A in FIG. 4A merely logically and virtually represent a grouping of the plurality of layout devices 406A in the layout portion 400A. Therefore, the layout portion 400A may be a flat layout portion having only a single physical hierarchy at which the plurality of layout devices 406A are located.

FIG. 4B illustrates an example of manipulating the figure group 402A. More specifically, FIG. 4B graphically illustrates the example where a designer may grab the corner 402B along the boundary object of the figure group 402A in a graphical user interface (GUI) to alter the shape of the boundary object along the direction indicated by the arrowhead 404B to a modified boundary object 406B. It shall be noted that a figure group may be modified in many different ways, and that FIG. 4B merely illustrates an example by a designer's interacting with the layout through a GUI.

Furthermore, the modified boundary object 406B may exactly represent where the designer's pointer is stopped in some embodiments. In these embodiments, the modified boundary object is shown as where the designer's pointer stops, regardless of whether this modified boundary object leads to an arrangement of the plurality of legal devices that satisfies or violates one or more design rules. In some other embodiments, the modified boundary object illustrated in FIG. 4B may represent a legal bounding box in which the plurality of layout devices, when inserted into the modified boundary object, satisfy one or more pertinent design rules. In the latter embodiments, these techniques described herein capture the location of the designer's pointer and calculate the legal bounding box in the proximity of the location. In some of these embodiments, the legal bounding box may dynamically change with the changing locations of the designer's pointer and may remain at a specific legal bounding box (e.g., the minimal bounding box) once the designer's pointer moves beyond a certain point or location.

FIG. 4C illustrates that in response to the modification to the boundary object of the figure group, the plurality of layout devices are reinstalled into the modified figure group 402C with the modified boundary object. More details about reinstalling layout devices are described above with reference to FIGS. 2 and 3A-B.

FIG. 4D illustrates another example of manipulating the figure group 402A. More specifically, FIG. 4D again graphically illustrates the example where a designer may grab the corner 402B along the boundary object of the figure group 402A in a graphical user interface (GUI) to alter the shape of the boundary object along the direction indicated by the arrowhead 402D to a modified boundary object 404D. As it can be seen from FIGS. 4B and 4D, the modified boundary object 404D in FIG. 4D is apparently smaller than the modified boundary object 406B in FIG. 4B. In this example illustrated in FIG. 4D, it is assumed that the modified boundary object 404D is smaller than the minimal bounding box in which the plurality of layout devices 406A can be legally placed.

FIG. 4E illustrates the result of the modification to the boundary object of the figure group in FIG. 4D. More specifically, in response to the modification to produce the modified boundary object 404D, these techniques may have several options to implement the modification. For example, these techniques may reinstall the plurality of layout devices 406A with the modified boundary object 404D as specified by the designer in some embodiments even if the modified boundary object 404D is not sufficient to contain all the plurality of layout devices 406A without overlaps.

In some of these embodiments, these techniques may suggest the smallest bounding box 402E that accommodate the plurality of layout devices 406A without overlaps although such an arrangement may or may not necessarily be legal. In addition or in the alternative, these techniques may suggest the smallest legal bounding box 404E that accommodate the plurality of layout devices 406A in a legal arrangement. In some other embodiments, these techniques may reinstall some or all of the plurality of layout devices 406A so that the plurality of layout devices 406A fit within the smallest bounding box 402E that causes no overlaps and represents the absolutely smallest silicon area needed for the plurality of layout devices 406A. Yet in some other embodiments, these techniques may reinstall some or all of the plurality of layout devices 406A into the smallest legal bounding box 404E.

FIG. 4F illustrates another example of a layout portion 400F including a plurality of layout devices 404F inserted in a placement row 402F. As it may be seen from FIG. 4F, the plurality of layout devices 404F are not aligned in the placement row 402F. A layout like what FIG. 4F may be created by, for example, manually dragging the plurality of layout devices into the placement row 402F while the snapping or alignment functions of the EDA tool is switched off.

FIG. 4G illustrates an example of aligning the misaligned plurality of layout devices 404F in FIG. 4F into the aligned plurality of layout devices 402G. This may be done by creating a figure group for the plurality of layout devices 404F or manipulating an existing figure group for the plurality of layout devices 404F, and these techniques may automatically align the plurality of layout devices 404F into the aligned plurality of layout devices 402G that are aligned with respect to the bottom edges of the plurality of layout devices 404F.

FIG. 4H illustrates another example of aligning the misaligned plurality of layout devices 404F in FIG. 4F into the aligned plurality of layout devices 402H. This may be done by creating a figure group for the plurality of layout devices 404F or manipulating an existing figure group for the plurality of layout devices 404F, and these techniques may automatically align the plurality of layout devices 404F into the aligned plurality of layout devices 402H that are aligned with respect to the top edges of the plurality of layout devices 404F.

FIG. 4I illustrates another example of aligning the misaligned plurality of layout devices 404F in FIG. 4F into the aligned plurality of layout devices 402I. This may be similarly done by creating a figure group for the plurality of layout devices 404F or manipulating an existing figure group for the plurality of layout devices 404F, and these techniques may automatically align the plurality of layout devices 404F into the aligned plurality of layout devices 402I that are aligned with respect to the centerlines of the plurality of layout devices 404F.

FIG. 4J illustrates another example of aligning the misaligned plurality of layout devices 404F in FIG. 4F into the aligned plurality of layout devices 402I. This may be similarly done by creating a figure group for the plurality of layout devices 404F or manipulating an existing figure group for the plurality of layout devices 404F, and these techniques may automatically align the plurality of layout devices 404F into the aligned plurality of layout devices 402I that are aligned with respect to the bottom edges of the plurality of layout devices 404F as in FIG. 4J. In addition, FIG. 4J further illustrates that in addition to aligning the plurality of layout devices, these techniques may further position the plurality of layout devices 402J at proper spacing values as governed by one or more pertinent design rules.

FIG. 4K illustrates a working example of an electronic design with the schematic view 408K and the corresponding layout view 402K. The layout view also includes a plurality of layout devices in a figure group 404K. Reference numeral 406K represents a corner of the boundary object of the figure group 404K. Each of the four corners as well as the four boundary segments of the boundary object may be used to resize or reshape the figure group 404K. FIG. 4L illustrates that a designer may resize the boundary object of the figure group 404K by dragging the corner 406K from the location 406L to the new location 402L to form the modified boundary object for the modified figure group. The plurality of layout devices in the figure group may then be reinstalled in the modified figure group 404L.

FIG. 4M illustrates a working example of a portion of a layout including a plurality of layout devices (402M, 404M, 406M, 408M, 410M, 412M, and 414M) in a figure group 400M without the highlighted boundary object. As it can be seen from FIG. 4M, the plurality of devices are not entirely aligned in the figure group 400M. FIG. 4N illustrates that these techniques described herein align the plurality of layout devices in the figure group 402N.

FIG. 4O illustrates another working example of a portion of a layout including a figure group 402O that further comprises a plurality of layout devices. FIG. 4P illustrates a manipulation on the figure group 402O to modify the size and shape of the boundary object of the figure group. In response to the manipulation of the figure group, these techniques described herein reinstall the plurality of layout devices as shown in the modified figure group 402P.

Figure 5:
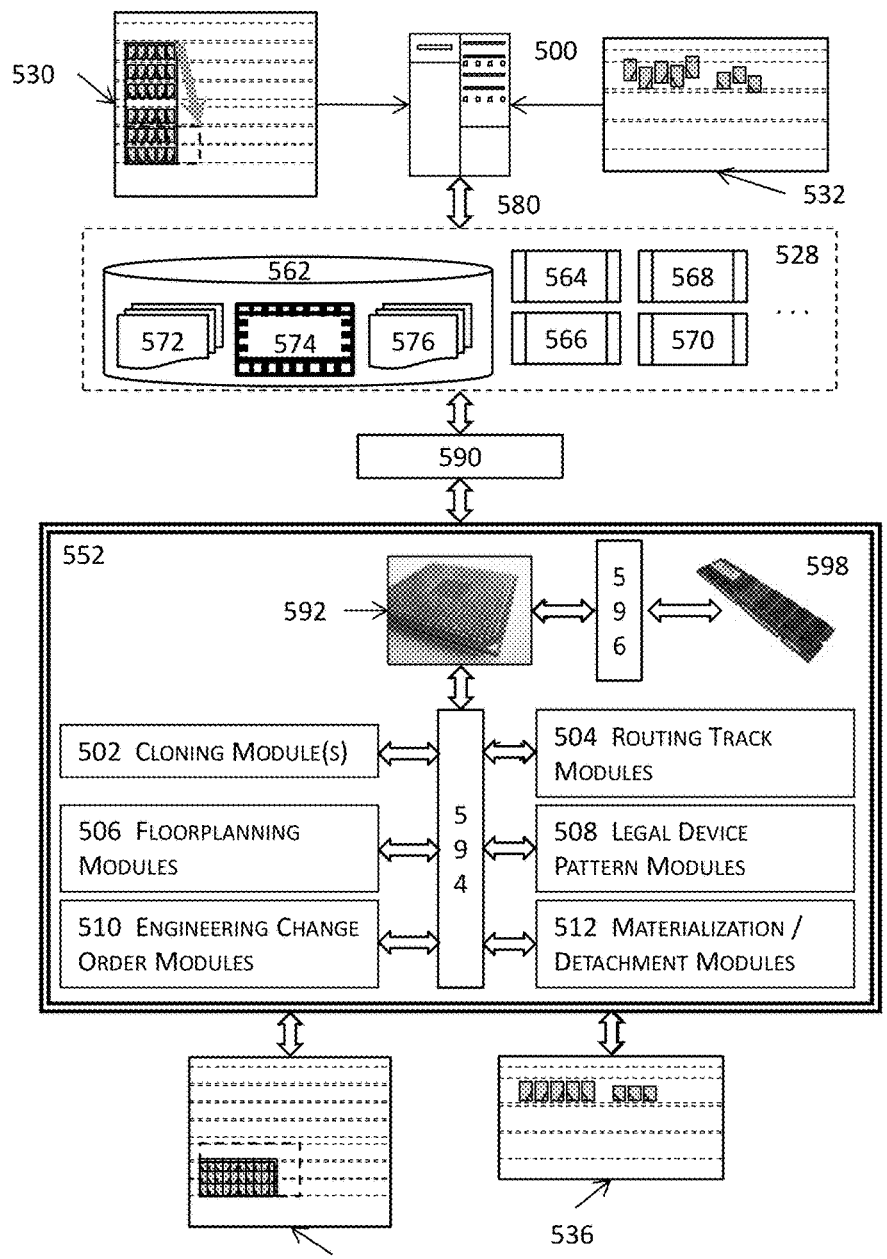
FIG. 5 illustrates another high level block diagram of a simplified system for implementing a floorplan with virtual hierarchies and figure groups for an electronic design in one or more embodiments.

FIG. 5 illustrates another high level block diagram of a simplified system for implementing a floorplan with virtual hierarchies and figure groups for an electronic design in one or more embodiments. In these one or more embodiments, the hardware system in FIG. 5 may comprise one or more computing systems 500, such as one or more general purpose computers described in the System Architecture Overview section to implement one or more special proposes. The illustrative computing system 600 may include an Internet-based computing platform providing a shared pool of configurable computer processing resources (e.g., computer networks, servers, storage, applications, services, etc.) and data to other computers and devices in an ubiquitous, on-demand basis via the Internet. For example, the computing system 600 may include or may be a part of a cloud computing platform in some embodiments.

In some embodiments, the one or more computing systems 500 may invoke various system resources such as the processor(s) or processor core(s), memory, disks, etc. and receive a layout 530 including a figure group having a plurality of layout devices. The one or more computing systems 500 receive a request to resize or reshape the figure group to a different size or shape, perform the resizing or reshaping to modify the original figure group into a modified figure group. The one or more computing systems 500 then reinstall one or more layout devices into the modified figure group as shown in the modified layout 534. The one or more computing systems 500 may further receive a layout 532 including a plurality of layout devices that are not aligned. For example, the plurality of layout devices may be populated into the layout 532 without regard to any alignment requirements. The plurality of layout devices may or may not be included in a figure group. The one or more computing systems 500 may perform an operation to align the plurality of layout devices and modify the layout 532 into a modified layout 536.

The one or more computing systems 500 may further write to and read from a local or remote non-transitory computer accessible storage 562 that stores thereupon data or information such as, but not limited to, one or more databases (574) such as schematic design database(s) or physical design database(s), electronic circuit design specification database(s), various statistics, various data, rule decks, various design rules, constraints, etc. (572), or other information or data (576) that may be used to facilitate the performance of various functions to achieve the intended purposes.

The one or more databases 574 may further include a plurality of cells, blocks, or modules (collectively a cell for singular and cells for plural). Cells may include, for example, one or more standard cells, one or more library cells, one or more memory cells, one or more macro cells, or any combinations thereof. A cell may be an object of a class in the paradigm of object oriented programming and may thus be instantiated into multiple instances to create at least a portion of a hierarchical physical design (e.g., a floorplan, a layout, etc.) or to create a larger and/or more complex cell in some embodiments. In the real hierarchy structure of a hierarchical physical design, certain cells may be situated at the lowest hierarchical level and do not contain any lower hierarchies.

In some embodiments, the one or more computing systems 500 may include or, either directly or indirectly through the various resources 528, invoke a set of mechanisms or modules 552 including hardware and software modules or combinations of one or more hardware and one or more software modules that are stored at least partially in computer memory may comprises one or more cloning modules 502 to identify and/or create clones.

A cloning module 502 may by itself or in tandem with one or more other modules identify or create clones in the layout 532 that may be optionally materialized into a physical block or cell 534. The one or more computing systems 500 may also initiate or interact with other computing systems to access, via a computer bus architecture (e.g., a system bus, a control bus, a data bus, or any combinations thereof), various resources 528 that may comprise a floorplanner, a placement module, a global routing module, and/or a detail routing module 564, a layout editor 566, a design rule checker 568, a verification engine 570, etc.

The set of modules 552 may further include one or more routing track modules 504 to manage and determine routing tracks that may be inherited by various figure groups at one or more virtual hierarchies without causing any violations of rules for routing track assignments, routing track coloring, etc. The set of modules 552 may further optionally include one or more floorplanning modules 506 to perform design planning or floorplanning to create a floorplan Constraints, design rules, and requirements are collectively referred to as a design rule for singular or design rules for plural. In addition or in the alternative, the set of modules 552 may further include one or more legal device pattern modules 508 to identify and/or create legal device patterns into one or more figure groups so that all the pertinent rules or requirements will be automatically complied with so long as the arrangements in these legal device patters are observed.

In some embodiments, the set of modules 552 may further include one or more engineering change order (ECO) modules 510 to function in tandem with figure groups and virtual hierarchies to implement engineering change orders. The set of modules 552 may also include a detachment or materialization module 512 to materialize a figure group into a physical block and to materialize a virtual hierarchy into a physical hierarchy and update the physical hierarchical structure of a layout accordingly. Any of these modules described may be stored at least partially in memory and include or function in tandem with one or more microprocessors or one or more processor cores to perform respective functions described herein.

The set of modules 552 may further optionally include one or more signoff modules (not shown) to perform various signoff and design closure tasks to ensure that the electronic design implemented by various techniques described herein may be successfully fabricated while maintaining various performance, cost, reliability, and manufacturability requirements.

For example, the one or more signoff modules may include one or more timing signoff modules to perform timing analyses and timing closure related tasks (e.g., silicon-accurate timing signoff, signal integrity analyses, etc.) to ensure an electronic design meets power, performance, or other requirements before tapeout, one or more signoff parasitic extraction modules to provide silicon-accurate interconnect parasitic extraction and ensure first-pass silicon success, and one or more power signoff modules to perform various power integrity analyses, transistor-level electromigration and IR-drop analyses, or other power and signal integrity analyses with SPICE-level accuracy or better accuracy with SPICE or SPICE-like simulations (e.g., Fast-SPICE, HSPICE, PSPICE, or any other SPICE-based or SPICE-compatible simulations) to ensure an electronic design meets or exceeds power, performance, and/or area goals in some embodiments.

The one or more signoff modules may include one or more physical verification modules (not shown) to perform various design rule checking, layout vs. schematic (LVS), etc. tasks to ensure that an electronic design meets or exceeds various spatial and other physical rules and one or more design for manufacturing (DFM) modules to address physical signoff and electrical variability optimization, correct lithography hotspots, predict silicon contours, improve yield, detect and repair timing and leakage hotspots to achieve variation- and manufacturing-aware signoff and design closure in some of these embodiments.

In addition or in the alternative, the one or more signoff modules may include one or more one or more computational lithography modules (not shown) to provide more accurate post-etch critical dimension accuracy and process windows on silicon, reticle and wafer synthesis, etc. to eliminate errors and/or reduce mask-manufacturing cycle times. One or more of these signoff modules may operate on the electronic design produced or modified with various techniques to be described in the following sections for proper signoff and design closure so that the signoff version of the electronic design may be properly manufactured with first-pass or fewer passes silicon success in some embodiments. In these embodiments, the signoff version of the electronic design produced or modified with various techniques described herein causes the underlying electronic circuit to be manufactured by a foundry or IC (integrated circuit) fabrication facility when the signoff version of the electronic design is forwarded to the foundry or IC (integrated circuits) fabrication facility that in turn fabricates the requisite photomasks and the eventual electronic circuit.

In some embodiments, the computing system 500 may include the various resources 528 such that these various resources may be invoked from within the computing system via a computer bus 580 (e.g., a data bus interfacing a microprocessor 592 and the non-transitory computer accessible storage medium 598 or a system bus 590 between a microprocessor 592 and one or more engines in the various resources 528). In some other embodiments, some or all of these various resources may be located remotely from the computing system 500 such that the computing system may access the some or all of these resources via a computer bus 580 and one or more network components.

The computing system may also include one or more modules in the set of modules 552. These one or more modules in the set 552 may include or at least function in tandem with a microprocessor 592 via a computer bus 594 in some embodiments. In these embodiments, a single microprocessor 592 may be included in and thus shared among more than one module even when the computing system 500 includes only one microprocessor 592. A microprocessor 592 may further access some non-transitory memory 598 (e.g., random access memory or RAM) via a system bus 596 to read and/or write data during the microprocessor's execution of processes.

In various embodiments described herein, a layout may be generated by proceeding through the floorplanning stage, the placement stage, and the routing stage before the layout may be further processed for various verification and optimization tasks. A designer may often need to manipulate a plurality of layout components. For example, a designer may need to change the arrangement of a plurality of layout components from four rows of four layout components in each row to two rows of eight components in a cell. Conventional approaches require checking out all sixteen layout components and the cell from the layout database, remove the top two rows each including four layout components, and add four layout components to each of the remaining two rows. Conventional approaches thus require a large amount of computational resources in terms of at least network access as well as the runtime and memory footprint of checking out and accessing the cell as well as the individual layout components.

These techniques described herein conserve computational resource utilization without checking out and checking in the cell or the individual layout components from the layout database. Rather, these techniques may simply access the figure group including four rows of figures representing the four rows of layout components, remove the top two rows each having four figures, adding four figures to each of the two remaining rows while observing the controlling design rules and constraints, and save the figure group.

System Architecture Overview

Figure 6:
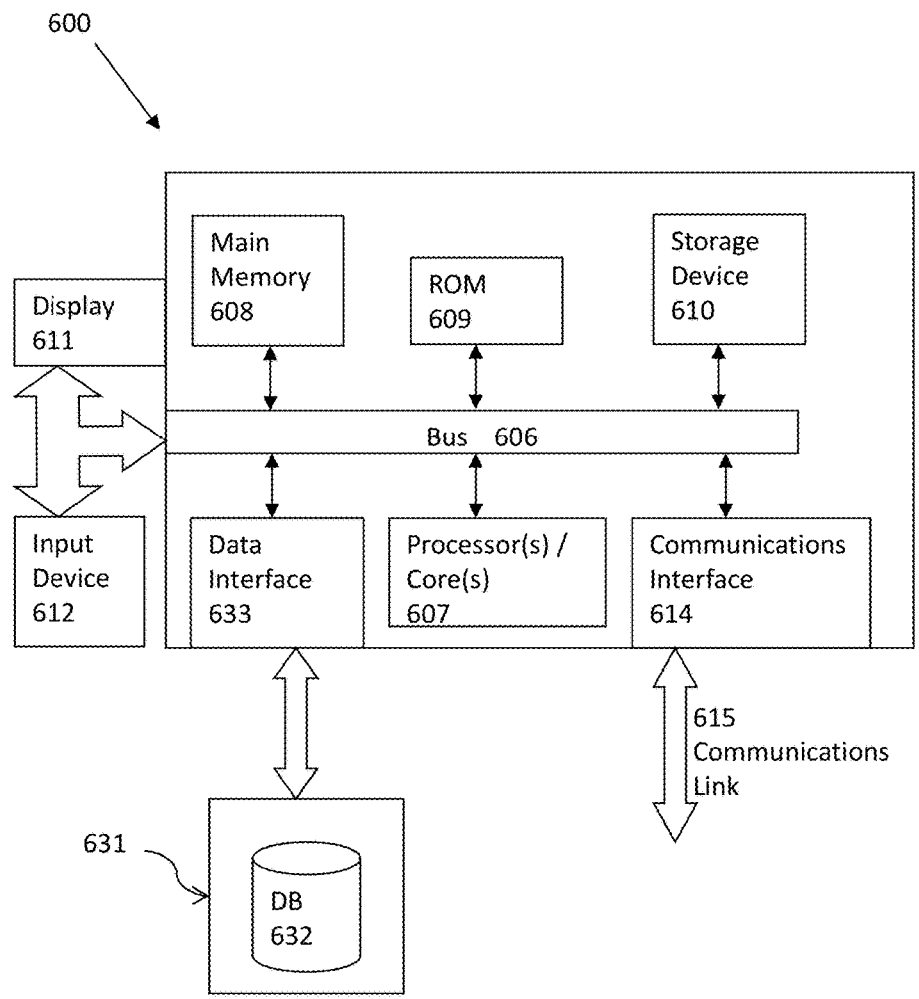
FIG. 6 illustrates a computerized system on which a method for implementing a floorplan with virtual hierarchies and figure groups for an electronic design may be implemented.

FIG. 6 illustrates a computerized system on which a method for implementing a floorplan with virtual hierarchies and figure groups for an electronic design may be implemented. Computer system 600 includes a bus 606 or other communication module for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control (not shown). The illustrative computing system 600 may include an Internet-based computing platform providing a shared pool of configurable computer processing resources (e.g., computer networks, servers, storage, applications, services, etc.) and data to other computers and devices in an ubiquitous, on-demand basis via the Internet. For example, the computing system 600 may include or may be a part of a cloud computing platform in some embodiments.

According to one embodiment, computer system 600 performs specific operations by one or more processor or processor cores 607 executing one or more sequences of one or more instructions contained in system memory 608. Such instructions may be read into system memory 608 from another computer readable/usable storage medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 607, where the one or more processors, one or more processor cores, or combination thereof executes one or more threads. For example, the acts of determination, extraction, stitching, simulating, annotating, analyzing, optimizing, and/or identifying, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any non-transitory medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program (e.g., application code) through communication link 615 and communication interface 614. Received program code may be executed by processor 607 as it is received, and/or stored in disk drive 610, or other non-volatile storage for later execution. In an embodiment, the computer system 600 operates in conjunction with a data storage system 631, e.g., a data storage system 631 that includes a database 632 that is readily accessible by the computer system 600. The computer system 600 communicates with the data storage system 631 through a data interface 633. A data interface 633, which is coupled to the bus 606 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 633 may be performed by the communication interface 614.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

I claim:

1. A computer-implemented method for implementing a floorplan with virtual hierarchies and figure groups for an electronic design, the computer-implemented method comprising:
   executing, at a floorplanning module coupled to a microprocessor of a computing system, a sequence of instructions to perform a process, the process comprising:
   identifying a plurality of layout circuit component designs in a layout of an electronic design;
   identifying or creating a figure group for the plurality of layout circuit component designs in the layout;
   modifying, at the floorplanning module, the layout into a modified layout in response to a request for a modification of the figure group at least by applying one or more modifications of the layout to the figure group; and
   reinstalling at least one layout circuit component design of the plurality of layout circuit component designs in the modified figure group.

2. The computer-implemented method of claim 1, the process further comprising:
   materializing the modified figure group into a physical cell or a physical block; and
   updating a layout database with information about the physical cell or the physical block.

3. The computer-implemented method of claim 2, wherein the process further comprises:
   identifying a virtual hierarchy at which the modified figure group is located;
   determining whether the virtual hierarchy has been materialized; and
   materializing the virtual hierarchy into a physical hierarchy when the virtual hierarchy is determined not to have been materialized.

4. The computer-implemented method of claim 3, wherein the process further comprises:
   identifying a physical hierarchical structure comprising one or more physical hierarchies for the layout;
   updating the physical hierarchical structure to add the physical hierarchy to the physical hierarchical structure when the virtual hierarchy is materialized in response to a determination that the virtual hierarchy has not been materialized; and
   updating a layout database with information about the physical hierarchy.

5. The computer-implemented method of claim 1, wherein the process further comprises:
   identifying a boundary object of the figure group;
   receiving the request for the modification; and
   modifying the figure group into the modified figure group at least by altering the boundary object into a modified boundary object having a size or a shape different from that of the boundary object.

6. The computer-implemented method of claim 5, wherein the process further comprises:
   removing the plurality of layout circuit component designs from the figure group; and
   reinserting the plurality of layout circuit component designs into the modified boundary object of the modified figure group.

7. The computer-implemented method of claim 6, wherein the process further comprises:
   identifying one or more design rules; and
   improving an arrangement of the plurality of layout circuit component designs at least by invoking a placement engine to place the plurality of circuit component designs based in part or in whole upon the one or more design rules.

8. The computer-implemented method of claim 5, wherein the process further comprises:
   removing one or more layout circuit component designs but not the plurality of layout circuit component designs from the figure group; and
   reinserting the one or more layout circuit component designs into the modified boundary object of the modified figure group.

9. The computer-implemented method of claim 8, wherein the process further comprises:
   adjusting one or more other layout circuit component designs in the modified figure group in response to the act of reinserting the one or more layout circuit component designs into the modified boundary object of the modified figure group.

10. The computer-implemented method of claim 5, wherein the process further comprises:
    identifying one or more design rules; and
    improving an arrangement of the plurality of layout circuit component designs at least by invoking a placement engine to place the plurality of circuit component designs based in part or in whole upon the one or more design rules.

11. The computer-implemented method of claim 5, wherein the process further comprises:
    determining whether the plurality of layout circuit component designs fit within the modified boundary object;
    recommending a new modified boundary object for the modified figure group, wherein the plurality of layout circuit component designs fit within the new modified boundary object; and
    overlaying the new modified boundary object in a user interface with the modified boundary object for the modified figure group.

12. The computer-implemented method of claim 5, wherein the process further comprises:
    determining whether the plurality of layout circuit component designs fit within the modified boundary object; and
    forcing the plurality of layout circuit component designs within the modified boundary object when the plurality of layout circuit component designs are determined not to fit within the modified boundary object.

13. The computer-implemented method of claim 1, wherein the process further comprises:
    determining whether a group of synchronous clones have been created for the figure group;
    modifying a master block for the group of synchronous clones according to the request for the modification; and
    populating the modification to one or more other synchronous clones in the group of synchronous clones.

14. The computer-implemented method of claim 1, wherein the process further comprises:
    identifying one or more design rules;
    improving an arrangement of the plurality of layout circuit component designs at least by invoking a placement engine to place the plurality of circuit component designs to generate a placed figure group based in part or in whole upon the one or more design rules;
    materializing the placed figure group into a physical cell or a physical block; and
    updating a layout database with information about the physical cell or the physical block.

15. A system for implementing clones for an electronic design, the system comprising:
    non-transitory computer accessible storage medium storing thereupon program code;
    a physical implementation module that is stored at least partially in memory of one or more computing systems, include or function in conjunction with at least one micro-processor of the one or more computing systems, and are configured to execute the program code to identify a plurality of layout circuit component designs in a layout of an electronic design;
    the physical implementation module further executing the program code to identify or create a figure group for the plurality of layout circuit component designs in the layout;
    the physical implementation module further executing the program code to modify the figure group into a modified figure group in response to a request for a modification of the figure group at least by applying one or more modifications of the layout to the figure group; and
    the physical implementation module further executing the program code to reinstall at least one layout circuit component design of the plurality of layout circuit component designs in the modified figure group.

16. The system for claim 15, the physical implementation module further executing the program code to:
    materialize the modified figure group into a physical cell or a physical block;
    update a layout database with information about the physical cell or the physical block;
    identify a virtual hierarchy at which the modified figure group is located; and
    determine whether the virtual hierarchy has been materialized.

17. The system for claim 16, the physical implementation module further executing the program code to:
    materialize the virtual hierarchy into a physical hierarchy when the virtual hierarchy is determined not to have been materialized;
    identify a physical hierarchical structure comprising one or more physical hierarchies for the layout;
    update the physical hierarchical structure to add the physical hierarchy to the physical hierarchical structure when the virtual hierarchy is materialized in response to a determination that the virtual hierarchy has not been materialized; and update a layout database with information about the physical hierarchy.

18. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for implementing a floorplan with virtual hierarchies and figure groups for an electronic design, the set of acts comprising:

executing, at a floorplanning module coupled to a microprocessor of a computing system, a sequence of instructions to perform a process, the process comprising:

identifying a plurality of layout circuit component designs in a layout of an electronic design;

identifying or creating a figure group for the plurality of layout circuit component designs in the layout;

modifying, at the floorplanning module, the figure group into a modified figure group in response to a request for a modification of the figure group at least by applying one or more modifications of the layout to the figure group; and reinstalling at least one layout circuit component design of the plurality of layout circuit component designs in the modified figure group.

19. The article of manufacture of claim 18, the set of acts further comprising:

identifying a boundary object of the figure group;

receiving the request for the modification;

modifying the figure group into the modified figure group at least by altering the boundary object into a modified boundary object having a size or a shape different from that of the boundary object;

removing the plurality of layout circuit component designs from the figure group; and reinserting the plurality of layout circuit component designs into the modified boundary object of the modified figure group.

20. The article of manufacture of claim 19, the set of acts further comprising:

determining whether the plurality of layout circuit component designs fit within the modified boundary object;

recommending a new modified boundary object for the modified figure group, wherein the plurality of layout circuit component designs fit within the new modified boundary object; and overlaying the new modified boundary object in a user interface with the modified boundary object for the modified figure group or forcing the plurality of layout circuit component designs within the modified boundary object when the plurality of layout circuit component designs are determined not to fit within the modified boundary object.

* * * * *